United States Patent
Suto et al.

(10) Patent No.: US 8,724,261 B2
(45) Date of Patent: May 13, 2014

(54) HIGH-FREQUENCY MAGNETIC FIELD GENERATION ELEMENT AND MAGNETIC HEAD

(71) Applicants: Hirofumi Suto, Tokyo (JP); Tao Yang, Kanagawa-ken (JP); Tazumi Nagasawa, Kanagawa-ken (JP); Kiwamu Kudo, Kanagawa-ken (JP); Rie Sato, Kanagawa-ken (JP); Koichi Mizushima, Kanagawa-ken (JP)

(72) Inventors: Hirofumi Suto, Tokyo (JP); Tao Yang, Kanagawa-ken (JP); Tazumi Nagasawa, Kanagawa-ken (JP); Kiwamu Kudo, Kanagawa-ken (JP); Rie Sato, Kanagawa-ken (JP); Koichi Mizushima, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/678,062

(22) Filed: Nov. 15, 2012

(65) Prior Publication Data
US 2013/0120875 A1    May 16, 2013

(30) Foreign Application Priority Data
Nov. 16, 2011 (JP) .................................. 2011-251144

(51) Int. Cl.
*G11B 5/31* (2006.01)

(52) U.S. Cl.
USPC ...................................................... 360/125.3

(58) Field of Classification Search
USPC ...................... 360/125.3, 125.71, 324–324.2
See application file for complete search history.

(56) References Cited

U.S. PATENT DOCUMENTS

| | | | |
|---|---|---|---|
| 8,462,461 B2 * | 6/2013 | Braganca et al. | 360/125.3 |
| 2012/0176702 A1 * | 7/2012 | Yamada et al. | 360/244 |
| 2013/0057983 A1 * | 3/2013 | Tanabe et al. | 360/234.3 |
| 2013/0063840 A1 * | 3/2013 | Koui et al. | 360/110 |
| 2013/0070367 A1 * | 3/2013 | Igarashi et al. | 360/75 |
| 2013/0222949 A1 * | 8/2013 | Braganca et al. | 360/324.11 |

FOREIGN PATENT DOCUMENTS

| | | |
|---|---|---|
| JP | 2008-123669 | 5/2008 |
| JP | 2008-277586 | 11/2008 |
| JP | 2008305486 A  * | 12/2008 |

* cited by examiner

*Primary Examiner* — Will J Klimowicz
(74) *Attorney, Agent, or Firm* — Finnegan, Henderson, Farabow, Garrett & Dunner, L.L.P.

(57) ABSTRACT

According to one embodiment, a high-frequency magnetic field generation element includes a first fixed layer, a first free layer, and a second free layer. A direction of a magnetization of the first fixed layer is fixed and has a component parallel to a first direction. A direction of a magnetization of the first free layer is variable and has a component orthogonal to the first direction. A direction of a magnetization of the second free layer is variable and has a component orthogonal to the first direction. The first fixed layer is provided between the first free layer and the second free layer. The magnetizations of the first free layer and the second free layer oscillate. A rotation direction of the magnetization of the first free layer is opposite to a rotation direction of the magnetization of the second free layer.

20 Claims, 21 Drawing Sheets

HIGH-FREQUENCY MAGNETIC FIELD GENERATION ELEMENT AND MAGNETIC HEAD

CROSS-REFERENCE TO RELATED APPLICATION

This application is based upon and claims the benefit of priority from the prior Japanese Patent Application No. 2011-251144, filed on Nov. 16, 2011; the entire contents of which are incorporated herein by reference.

FIELD

Embodiments described herein relate generally to a high-frequency magnetic field generation element and a magnetic head.

BACKGROUND

A magnetic recording technology that utilizes magnetization states to perform the recording and reproduction of information has features of large capacity, high speed, and low cost. These days, from a viewpoint of further improvement in recording density etc., methods are proposed in which recording density is improved by manipulating and detecting magnetization using a magnetic resonance, which is a response of a magnetic material to a high-frequency magnetic field with a specific frequency.

For example, a microwave-assisted magnetic recording system is a technology in which a high-frequency magnetic field near a resonance frequency of a magnetic recording medium is applied to the medium and at the same time a magnetic field is applied, and a magnetization reversal occurs by a magnetic field weaker than the coercive field.

In such magnetic recording, further improvement in recording density is desired.

DETAILED DESCRIPTION

Figure 1A:
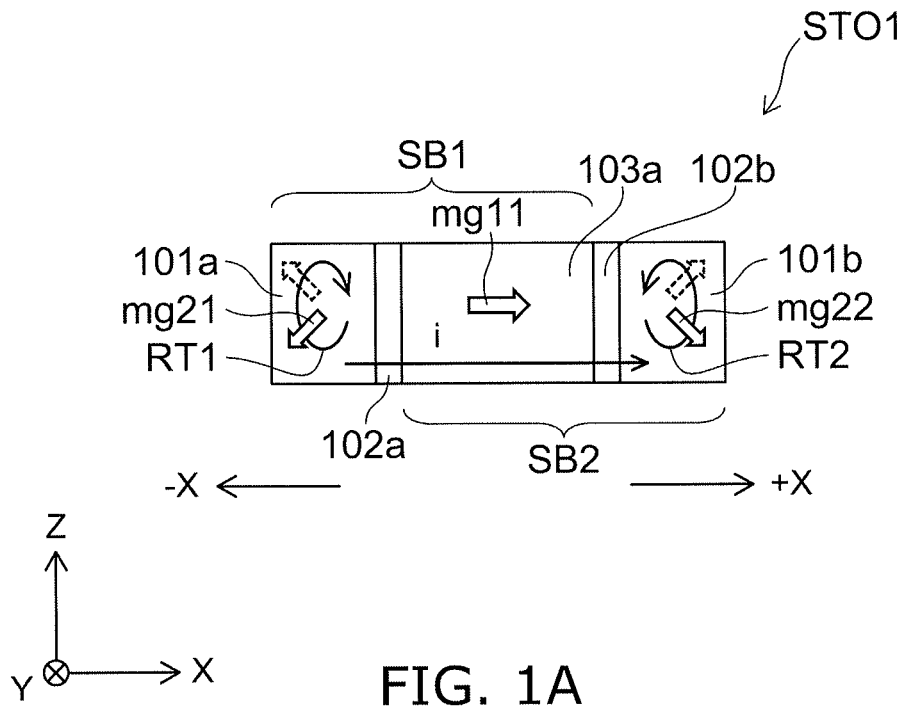
FIGS. 1A to 1B are schematic diagrams illustrating a high-frequency magnetic field generation element according to a first embodiment.

According to one embodiment, a high-frequency magnetic field generation element includes: a first fixed layer, a direction of a magnetization of the first fixed layer being fixed and having a component parallel to a first direction, a first free layer stacked with the first fixed layer, a direction of a magnetization of the first free layer being variable and having a component orthogonal to the first direction, and a second free layer stacked with the first free layer, a direction of a magnetization of the second free layer being variable and having a component orthogonal to the first direction. The first fixed layer is provided between the first free layer and the second free layer. The first direction is parallel to a stacking direction of the first fixed layer, the first free layer, and the second free layer. The magnetization of the first free layer and the magnetization of the second free layer oscillate by a current flowing through the first free layer, the second free layer, and the first fixed layer. A rotation direction of the magnetization in the oscillation of the first free layer is opposite to a rotation direction of the magnetization in the oscillation of the second free layer.

According to another embodiment, a high-frequency magnetic field generation element includes: a first fixed layer, a direction of a magnetization of the first fixed layer being fixed and having a component parallel to a first direction; a first free layer stacked with the first fixed layer, a direction of a magnetization of the first free layer being variable and having a component orthogonal to the first direction; a second fixed layer, a direction of a magnetization of the second fixed layer being fixed and having a component parallel to the first direction; and a second free layer stacked with the second fixed layer, a direction of a magnetization of the second free layer being variable and having a component orthogonal to the first direction. The first direction is parallel to a stacking direction of the first fixed layer, the first free layer, and the second free layer. The magnetization of the first free layer oscillates by a current flowing through the first fixed layer and the first free layer. The magnetization of the second free layer oscillates by a current flowing through the second fixed layer and the second free layer. A rotation direction of the magnetization in the oscillation of the first free layer is opposite to a rotation direction of the magnetization in the oscillation of the second free layer.

According to another embodiment, a magnetic head includes: a main magnetic pole; a coil for recording configured to generate a recording magnetic field in the main magnetic pole; and a high-frequency magnetic field generation element disposed along with the main magnetic pole. The high-frequency magnetic field generation element includes: a first fixed layer, a direction of a magnetization of the first fixed layer being fixed and having a component parallel to a first direction; a first free layer stacked with the first fixed layer, a direction of a magnetization of the first free layer being variable and having a component orthogonal to the first direction, and a second free layer stacked with the first fixed layer, a direction of a magnetization of the second free layer being variable and having a component orthogonal to the first direction. The first fixed layer is provided between the first free layer and the second free layer. The first direction is parallel to a stacking direction of the first fixed layer, the first free layer, and the second free layer. The magnetization of the first free layer and the magnetization of the second free layer oscillate by a current flowing through the first free layer, the second free layer, and the first fixed layer. A rotation direction of the magnetization in the oscillation of the first free layer is opposite to a rotation direction of the magnetization in the oscillation of the second free layer.

Various embodiments will be described hereinafter with reference to the accompanying drawings.

The drawings are schematic or conceptual; and the relationships between the thickness and width of portions, the proportion of sizes among portions, etc. are not necessarily the same as the actual values thereof. Further, the size and proportion may be illustrated differently among drawings, even for identical portions.

In the specification of this application and the drawings, components similar to those described in regard to a drawing thereinabove are marked with the same reference numerals, and a detailed description is omitted as appropriate.

The high-frequency magnetic field generation element according to the embodiment can be used for, for example, magnetic heads that use a generated magnetic field to perform the recording and reproduction of information. In addition, the high-frequency magnetic field generation element according to the embodiment can be used also for, for example, nonvolatile memories. Thus, the high-frequency magnetic field generation element according to the embodiment can be used for any use in which a high-frequency magnetic field is generated. In the following, the case is described where the high-frequency magnetic field generation element according to the embodiment is used for a magnetic head.

First Embodiment

Figure 1B:
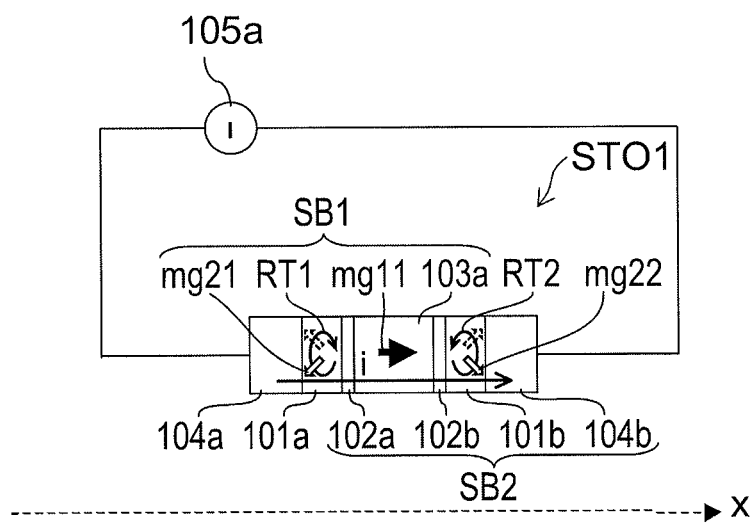

FIGS. 1A to 1B are schematic diagrams illustrating a high-frequency magnetic field generation element according to a first embodiment.

FIG. 1A shows the layer structure of a high-frequency magnetic field generation element STO 1 according to the first embodiment, and FIG. 1B shows a circuit configuration using the high-frequency magnetic field generation element STO 1.

In the following description, the high-frequency magnetic field generation element STO is referred to as simply an "STO."

As shown in FIG. 1A, the STO 1 includes a first fixed layer 103*a*, a first free layer 101*a*, and a second free layer 101*b* stacked with one another.

The direction of the magnetization mg11 of the first fixed layer 103*a* is fixed. The direction of the magnetization mg11 has a component parallel to a first direction. In the embodiment, the first direction is the +X direction (occasionally referred to as simply "X direction"). That is, the first direction is parallel to the stacking direction of the first fixed layer 103*a*, the first free layer 101*a*, and the second free layer 101*b*.

The opposite direction to the +X direction is the −X direction. One direction orthogonal to the X direction is the Y direction. The direction orthogonal to the X direction and the Y direction is the Z direction.

The magnetization mg11 of the first fixed layer 103*a* is directed in the +X direction, for example.

For the first fixed layer 103*a*, a Pt-based magnetic material such as CoPt and FePt, a CoCr-based magnetic material, and a rare-earth-based magnetic material such as TbFe and TbCo may be used. The magnetic materials have an easy axis in the perpendicular-to-plane direction.

The first free layer 101*a* is stacked with the first fixed layer 103*a* in a direction parallel to the X direction. In the STO 1, the first free layer 101*a* is stacked with the first fixed layer 103*a* in the −X direction.

The direction of the magnetization mg21 of the first free layer 101*a* is variable. The direction of the magnetization mg21 has a component orthogonal to the X direction.

A first intermediate layer 102*a* is provided between the first fixed layer 103*a* and the first free layer 101*a*. The first intermediate layer 102*a* may be any material capable of transferring spin torque. As an example, a metal such as Cu and an insulating material such as MgO are given.

In the STO 1, the first fixed layer 103*a*, the first free layer 101*a*, and the first intermediate layer 102*a* constitute a first stacked body SB1.

The second free layer 101*b* is stacked with the first fixed layer 103*a* in a direction parallel to the X direction. In the STO 1, the second free layer 101*b* is stacked with the first fixed layer 103*a* in the +X direction.

The direction of the magnetization mg22 of the second free layer 101*b* is variable. The direction of the magnetization mg22 has a component orthogonal to the X direction.

For the first free layer 101*a* and the second free layer 101*b*, a material having a high saturation magnetization such as NiFe and CoFe may be used in order to generate a large magnetic field during the oscillation. Furthermore, to adjust the anisotropic magnetic field and the saturation magnetic flux density, materials such as Al, Si, and B may be mixed. Also, stacking of the aforementioned materials can be used.

A second intermediate layer 102*b* is provided between the first fixed layer 103*a* and the second free layer 101*b*. The second intermediate layer 102*b* may be the same material as the first intermediate layer 102*a*. In the STO 1, the first fixed layer 103*a*, the second free layer 101*b*, and the second intermediate layer 102*b* constitute a second stacked body SB2.

In the STO 1, the first stacked body SB1 is placed next to the second stacked body SB2. These two stacking bodies share the first fixed layer 103*a*.

As shown in FIG. 1B, a first conductive unit 104*a* is connected to the first free layer 101*a* of the STO 1, and a second conductive unit 104*b* is connected to the second free layer 101*b*. A first current application mechanism 105*a* is connected to the first conductive unit 104*a* and the second conductive unit 104*b*.

The current i applied from the first current application mechanism 105*a* flows from the first conductive unit 104*a* through the first stacked body SB1 and the second stacked body SB2 in the +X direction, and returns from the second conductive unit 104*b* to the first current application mechanism 105*a*. Due to the current i, the magnetizations of the first free layer 101*a* and the second free layer 101*b* oscillate.

When the current i flows through the first free layer 101*a* and the second free layer 101*b*, the directions of the magnetizations mg21 and mg22 rotate by spin torque.

In the STO 1, when the current i flows in the +X direction, the rotation direction RT1 of the magnetization mg21 in the oscillation of the first free layer 101a becomes opposite to the rotation direction RT2 of the magnetization mg22 in the oscillation of the second free layer 101b.

Furthermore, in the STO 1, when the current i flows in the −X direction, the rotation direction RT1 and the rotation direction RT2 are reversed. Also in this case, the rotation direction RT1 becomes opposite to the rotation direction RT2.

That is, in the STO 1, the rotation direction RT1 and the rotation direction RT2 become opposite when the current i flows in either direction.

Second Embodiment

Figure 2A:
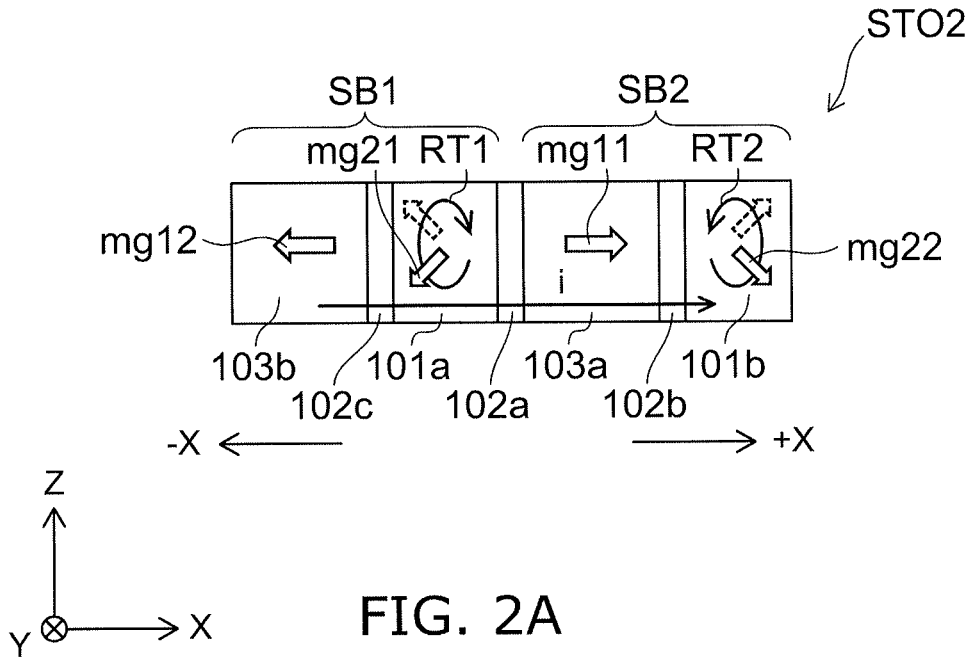
FIGS. 2A to 2B are schematic diagrams illustrating a high-frequency magnetic field generation element according to a second embodiment.
Figure 2B:
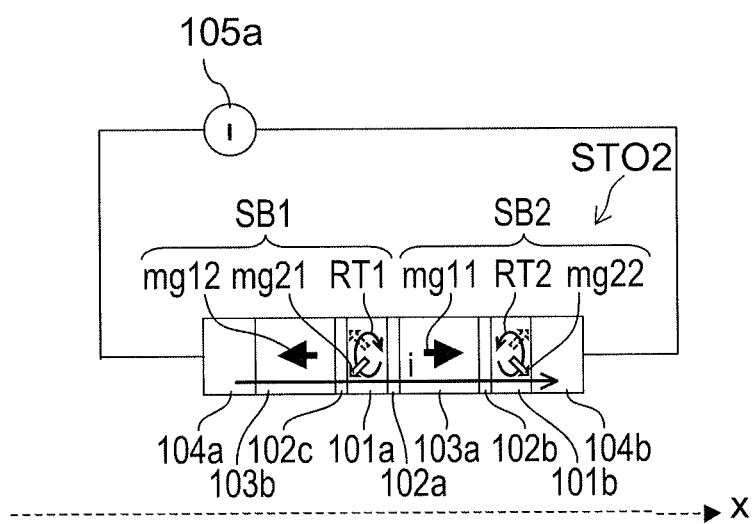

FIGS. 2A to 2B are schematic diagrams illustrating a high-frequency magnetic field generation element according to a second embodiment.

FIG. 2A shows the layer structure of an STO 2 according to the second embodiment, and FIG. 2B shows a circuit configuration using the STO 2.

As shown in FIG. 2A, the STO 2 includes the first fixed layer 103a, the first free layer 101a, the second free layer 101b, and a second fixed layer 103b stacked with one another.

The first fixed layer 103a, the first free layer 101a, and the second free layer 101b are the same as those of the STO 1. Also the first intermediate layer 102a and the second intermediate layer 102b are the same as those of the STO 1.

The direction of the magnetization mg12 of the second fixed layer 103b is fixed. The direction of the magnetization mg12 has a component parallel to the first direction. The first direction is parallel to the stacking direction of the first fixed layer 103a, the first free layer 101a, the second free layer 101b, and the second fixed layer 103b (the +X direction or the −X direction).

The magnetization mg12 of the second fixed layer 103b is directed in the −X direction, for example.

A third intermediate layer 102c is provided between the second fixed layer 103b and the first free layer 101a.

In the STO 2, the second fixed layer 103b, the first free layer 101a, and the third intermediate layer 102c constitute the first stacked body SB1. In the STO 2, the first fixed layer 103a, the second free layer 101b, and the second intermediate layer 102b constitute the second stacked body SB2.

In the STO 2, the first stacked body SB1 is placed next to the second stacked body SB2 parallel to the X direction via the first intermediate layer 102a.

As shown in FIG. 2B, the first conductive unit 104a is connected to the second fixed layer 103b of the STO 2, and the second conductive unit 104b is connected to the second free layer 101b. The first current application mechanism 105a is connected to the first conductive unit 104a and the second conductive unit 104b.

The current i applied from the first current application mechanism 105a flows from the first conductive unit 104a through the first stacked body SB1 and the second stacked body SB2 in the +X direction, and returns from the second conductive unit 104b to the first current application mechanism 105a. Due to the current i, the magnetizations of the first free layer 101a and the second free layer 101b oscillate.

That is, in the STO 2, when the current i flows in the +X direction, the rotation direction RT1 of the magnetization mg21 in the oscillation of the first free layer 101a becomes opposite to the rotation direction RT2 of the magnetization mg22 in the oscillation of the second free layer 101b.

Furthermore, in the STO 2, when the current i flows in the −X direction, the rotation direction RT1 and the rotation direction RT2 are reversed, respectively.

In the STO 2, the rotation direction RT1 and the rotation direction RT2 become opposite to each other when the current i flows in either direction.

The magnetization mg11 of the first fixed layer 103a may be directed in the −X direction. The magnetization mg12 of the second fixed layer 103b may be directed in the +X direction. When the direction of the magnetization mg11 is opposite to the direction of the magnetization mg12, the rotation direction RT1 and the rotation direction RT2 become opposite to each other when the current i flows in either direction.

The second embodiment has the advantage that the current amount necessary for oscillation can be reduced by the contribution from two fixed layers.

Third Embodiment

Figure 3A:
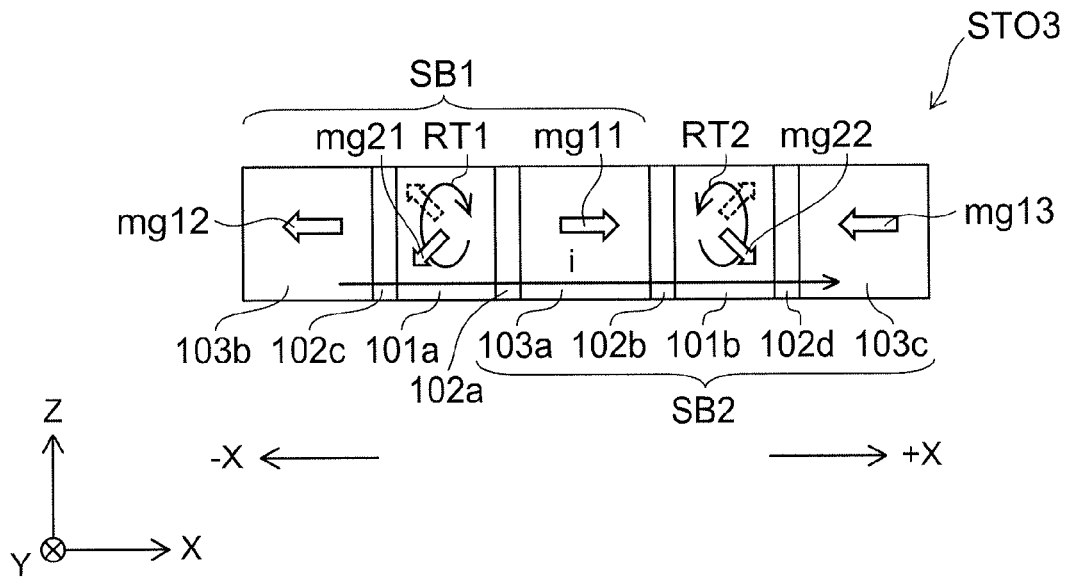
FIGS. 3A to 3B are schematic diagrams illustrating a high-frequency magnetic field generation element according to a third embodiment.
Figure 3B:
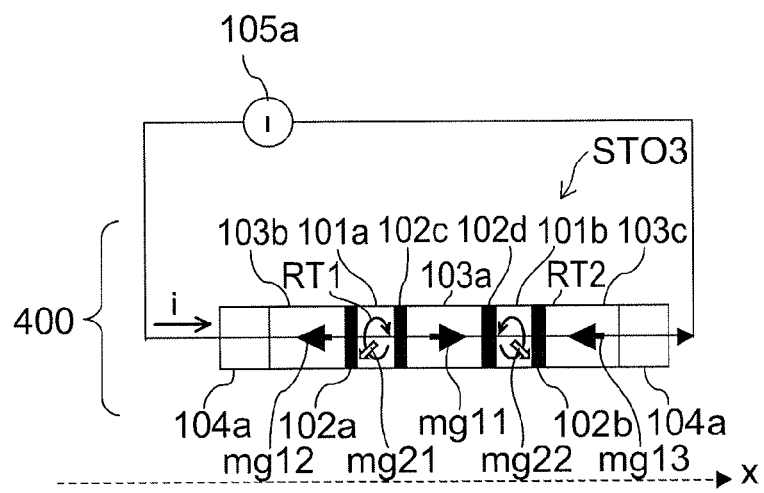

FIGS. 3A to 3B are schematic diagrams illustrating a high-frequency magnetic field generation element according to a third embodiment.

FIG. 3A shows the layer structure of an STO 3 according to the third embodiment, and FIG. 3B shows a circuit configuration using the STO 3.

As shown in FIG. 3A, the STO 3 includes the first fixed layer 103a, the first free layer 101a, the second free layer 101b, the second fixed layer 103b, and a third fixed layer 103c.

The first fixed layer 103a, the first free layer 101a, the second free layer 101b, and the second fixed layer 103b are the same as those of the STO 2. Also the first intermediate layer 102a, the second intermediate layer 102b, and the third intermediate layer 102c are the same as those of the STO 2.

The direction of the magnetization mg13 of the third fixed layer 103c is fixed. The direction of the magnetization mg13 has a component parallel to the first direction. The first direction is parallel to the stacking direction of the first fixed layer 103a, the first free layer 101a, the second free layer 101b, the second fixed layer 103b, and the third fixed layer 103c. The magnetization mg13 of the third fixed layer 103c is directed in the −X direction, for example.

A fourth intermediate layer 102d is provided between the third fixed layer 103c and the second free layer 101b.

In the STO 3, the second fixed layer 103b, the first free layer 101a, the first fixed layer 103a, the first intermediate layer 102a, and the third intermediate layer 102c constitute the first stacked body SB1. In the STO 3, the first fixed layer 103a, the second free layer 101b, the third fixed layer 103c, the second intermediate layer 102b, and the fourth intermediate layer 102d constitute the second stacked body SB2.

In the STO 3, the first stacked body SB1 is placed next to the second stacked body SB2 in a direction parallel to the X direction, with the first fixed layer 103a shared.

As shown in FIG. 3B, the first conductive unit 104a is connected to the second fixed layer 103b of the STO 3, and the second conductive unit 104b is connected to the third fixed layer 103c. The first current application mechanism 105a is connected to the first conductive unit 104a and the second conductive unit 104b.

The current i applied from the first current application mechanism 105a flows from the first conductive unit 104a through the first stacked body SB1 and the second stacked body SB2 in the +X direction, and returns from the second conductive unit 104b to the first current application mechanism 105a. Due to the current i, the magnetizations of the first free layer 101a and the second free layer 101b oscillate.

That is, in the STO 3, when the current i flows in the +X direction, the rotation direction RT1 of the magnetization mg21 in the oscillation of the first free layer 101a becomes opposite to the rotation direction RT2 of the magnetization mg22 in the oscillation of the second free layer 101b.

Furthermore, in the STO 3, when the current i flows in the −X direction, the rotation direction RT1 and the rotation direction RT2 reversed, respectively.

In the STO 3, the rotation direction RT1 and the rotation direction RT2 become opposite to each other when the current i flows in either direction.

The magnetization mg11 of the first fixed layer 103a may be directed in the −X direction. The magnetization mg12 of the second fixed layer 103b may be directed in the +X direction. The magnetization mg13 of the third fixed layer 103c may be directed in the +X direction. When the direction of the magnetization mg11 is opposite to the directions of the magnetizations mg12 and mg13, the rotation direction RT1 and the rotation direction RT2 become opposite to each other when either current i flows.

The third embodiment has the advantage that the oscillation frequencies of two free layers are close because the amounts of the spin torques acting on the first free layer 101a and the second free layer 101b are substantially equal.

Fourth Embodiment

Figure 4A:
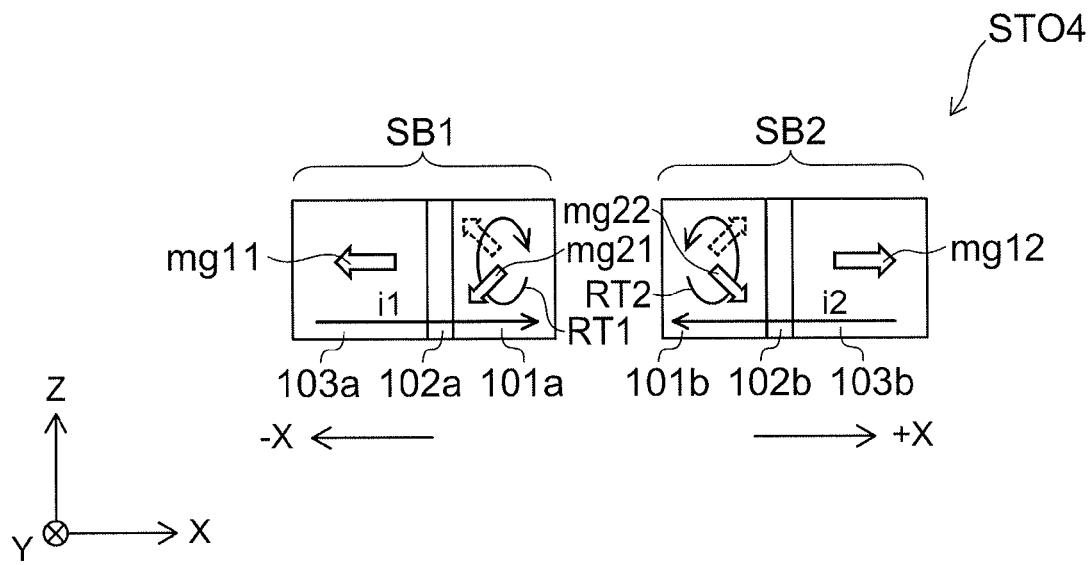
FIGS. 4A to 4B are schematic diagrams illustrating a high-frequency magnetic field generation element according to a fourth embodiment.
Figure 4B:
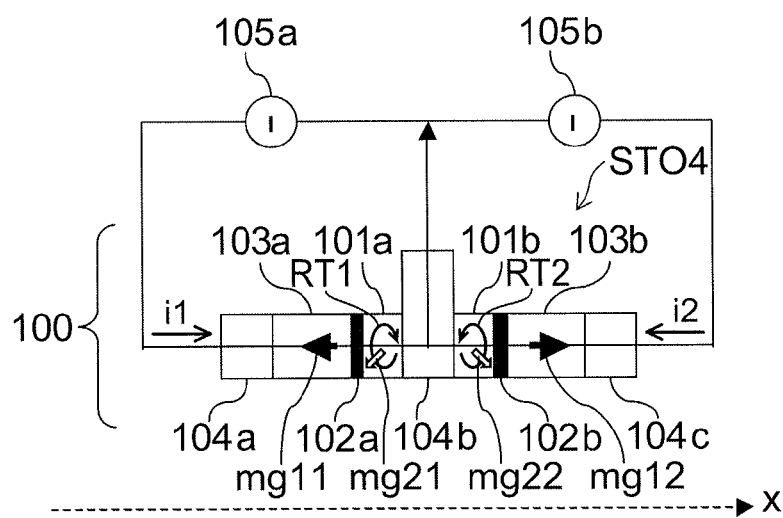

FIGS. 4A to 4B are schematic diagrams illustrating a high-frequency magnetic field generation element according to a fourth embodiment.

FIG. 4A shows the layer structure of an STO 4 according to the fourth embodiment, and FIG. 4B shows a circuit configuration using the STO 4.

As shown in FIG. 4A, the STO 4 includes the first fixed layer 103a, the first free layer 101a, the second free layer 101b, and the second fixed layer 103b.

The direction of the magnetization mg11 of the first fixed layer 103a is fixed. The direction of the magnetization mg11 has a component parallel to the X direction. The magnetization mg11 of the first fixed layer 103a is directed in the −X direction, for example.

The first free layer 101a is stacked with the first fixed layer 103a in a direction parallel to the X direction. In the STO 4, the first free layer 101a is stacked with the first fixed layer 103a in the +X direction.

The direction of the magnetization mg21 of the first free layer 101a is variable. The direction of the magnetization mg21 has a component orthogonal to the X direction.

The first intermediate layer 102a is provided between the first fixed layer 103a and the first free layer 101a. In the STO 4, the first fixed layer 103a, the first free layer 101a, and the first intermediate layer 102a constitute the first stacked body SB1.

The direction of the magnetization mg12 of the second fixed layer 103b is fixed. The direction of the magnetization mg12 has a component parallel to the X direction. The magnetization mg12 of the second fixed layer 103b is directed in the +X direction, for example.

The second free layer 101b is stacked with the second fixed layer 103b in a direction parallel to the X direction. In the STO 4, the second free layer 101b is stacked with the second fixed layer 103b in the −X direction.

The direction of the magnetization mg22 of the second free layer 101b is variable. The direction of the magnetization mg22 has a component orthogonal to the X direction.

The second intermediate layer 102b is provided between the second fixed layer 103b and the second free layer 101b. In the STO 4, the second fixed layer 103b, the second free layer 101b, and the second intermediate layer 102b constitute the second stacked body SB2.

In the STO 4, the first stacked body SB1 is placed next to the second stacked body SB2 in parallel to the X direction.

As shown in FIG. 4B, the STO 4 includes the first conductive unit 104a, the second conductive unit 104b, and a third conductive unit 104c.

The second conductive unit 104b is provided between the first free layer 101a and the second free layer 101b. The first stacked body SB1 is provided between the first conductive unit 104a and the second conductive unit 104b, and the second stacked body SB2 is provided between the third conductive unit 104c and the second conductive unit 104b.

The first current application mechanism 105a and a second current application mechanism 105b for applying spin torque currents necessary to excite the magnetization oscillations of the first free layer 101a and the second free layer 101b are connected to the STO 4.

The current i1 applied from the first current application mechanism 105a flows from the first conductive unit 104a through the first stacked body SB1 in the +X direction, and returns from the second conductive unit 104b to the first current application mechanism 105a. Due to the current i1, the magnetization of the first free layer 101a oscillates.

The current i2 applied from the second current application mechanism 105b flows from the third conductive unit 104c through the second stacked body SB2 in the −X direction, and returns from the second conductive unit 104b to the second current application mechanism 105b. Due to the current i2, the magnetization of the second free layer 101b oscillates.

That is, in the STO 4, when the current i1 in the +X direction flows through the first stacked body SB1 and the current i2 in the −X direction flows through the second stacked body SB2, the rotation direction RT1 of the magnetization mg21 in the oscillation of the first free layer 101a becomes opposite to the rotation direction RT2 of the magnetization mg22 in the oscillation of the second free layer 101b.

Furthermore, in the STO 4, when the current i1 in the −X direction flows through the first stacked body SB1 and the current i2 in the +X direction flows through the second stacked body SB2, the rotation direction RT1 and the rotation direction RT2 are reversed.

In the STO 4, the currents i1 and i2 flow in directions opposite to each other, and thereby the rotation direction RT1 and the rotation direction RT2 become opposite to each other.

The magnetization mg11 of the first fixed layer 103a may be directed in the +X direction. The magnetization mg12 of the second fixed layer 103b may be directed in the −X direction. When the direction of the magnetization mg11 is opposite to the direction of the magnetization mg12 and the direction of the current i1 is opposite to the direction of the current i2, the rotation direction RT1 and the rotation direction RT2 become opposite to each other.

Since the currents i1 and i2 are independently applied to the STO 4 from the two current application mechanisms (the first current application mechanism 105a and the second current application mechanism 105b), the currents i1 and i2 can be separately adjusted to individually control the oscillations of the first stacked body SB1 and the second stacked body SB2.

Fifth Embodiment

Figure 5A:
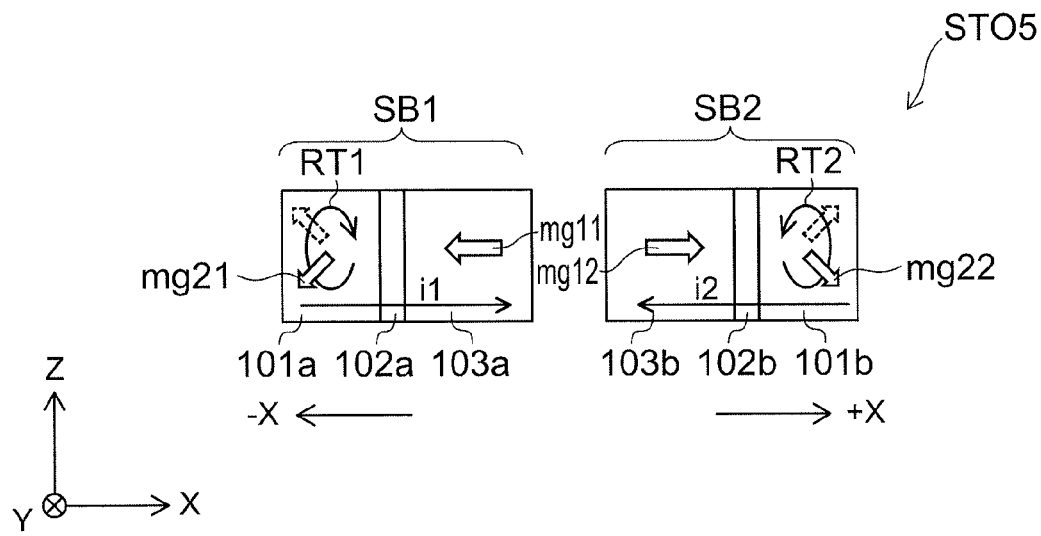
FIGS. 5A to 5B are schematic diagrams illustrating a high-frequency magnetic field generation element according to a fifth embodiment.
Figure 5B:
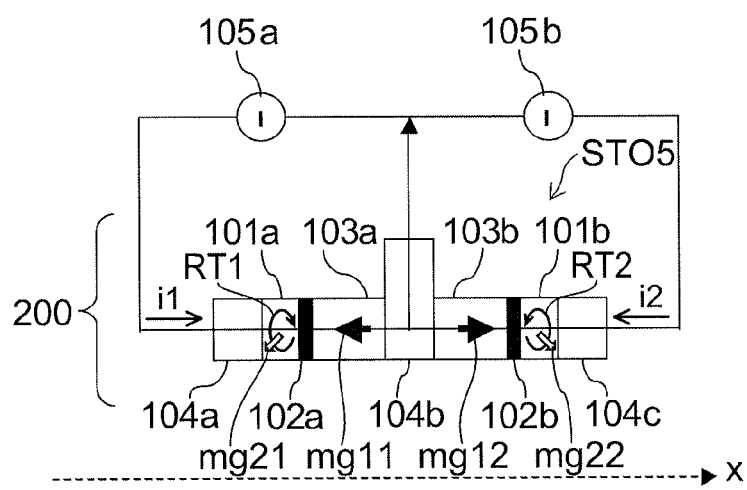

FIGS. 5A to 5B are schematic diagrams illustrating a high-frequency magnetic field generation element according to a fifth embodiment.

FIG. 5A shows the layer structure of an STO 5 according to the fifth embodiment, and FIG. 5B shows a circuit configuration using the STO 5.

As shown in FIG. 5A, the STO 5 includes the first fixed layer 103a, the first free layer 101a, the second free layer 101b, and the second fixed layer 103b.

Although the first fixed layer 103a, the first free layer 101a, the second free layer 101b, and the second fixed layer 103b included in the STO 5 are the same as those of the STO 4, arrangement is different.

In the STO 5, the first free layer 101a is stacked with the first fixed layer 103a in the −X direction. The second free layer 101b is stacked with the second fixed layer 103b in the +X direction.

In the STO 5, the first stacked body SB1 is placed next to the second stacked body SB2 parallel to the X direction. The first fixed layer 103a is separated from the second fixed layer 103b.

As shown in FIG. 5B, the STO 5 is provided with the first conductive unit 104a, the second conductive unit 104b, and the third conductive unit 104c.

The second conductive unit 104b is provided between the first fixed layer 103a and the second fixed layer 103b. The first stacked body SB1 is provided between the first conductive unit 104a and the second conductive unit 104b, and the second stacked body SB2 is provided between the third conductive unit 104c and the second conductive unit 104b.

The first current application mechanism 105a and the second current application mechanism 105b for applying spin torque currents necessary to excite the magnetization oscillations of the first free layer 101a and the second free layer 101b are connected to the STO 5.

The current i1 applied from the first current application mechanism 105a flows from the first conductive unit 104a through the first stacked body SB1 in the +X direction, and returns from the second conductive unit 104b to the first current application mechanism 105a. Due to the current i1, the magnetization of the first free layer 101a oscillates.

The current i2 applied from the second current application mechanism 105b flows from the third conductive unit 104c through the second stacked body SB2 in the −X direction, and returns from the second conductive unit 104b to the second current application mechanism 105b. Due to the current i2, the magnetization of the second free layer 101b oscillates.

That is, in the STO 5, when the current i1 in the +X direction flows through the first stacked body SB1 and the current i2 in the −X direction flows through the second stacked body SB2, the rotation direction RT1 of the magnetization mg21 in the oscillation of the first free layer 101a becomes opposite to the rotation direction RT2 of the magnetization mg22 in the oscillation of the second free layer 101b.

Furthermore, in the STO 5, when the current i1 in the −X direction flows through the first stacked body SB1 and the current i2 in the +X direction flows through the second stacked body SB2, the rotation direction RT1 and the rotation direction RT2 are reversed, respectively.

In the STO 5, the currents i1 and i2 flow in directions opposite to each other, and thereby the rotation direction RT1 and the rotation direction RT2 become opposite to each other.

The magnetization mg11 of the first fixed layer 103a may be directed in the +X direction. The magnetization mg12 of the second fixed layer 103b may be directed in the −X direction. When the direction of the magnetization mg11 is opposite to the direction of the magnetization mg12 and the direction of the current i1 is opposite to the direction of the current i2, the rotation direction RT1 and the rotation direction RT2 become opposite to each other.

In the STO 5, similarly to the STO 4, the currents i1 and i2 can be separately adjusted to individually control the oscillations of the first stacked body SB1 and the second stacked body SB2.

Sixth Embodiment

Figure 6A:
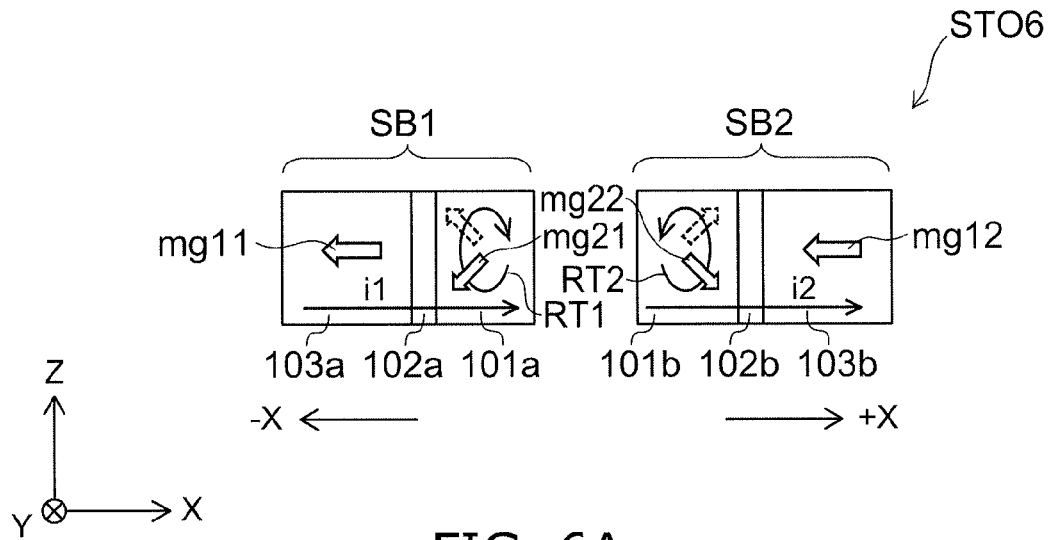
FIGS. 6A to 6B are schematic diagrams illustrating a high-frequency magnetic field generation element according to a sixth embodiment.
Figure 6B:
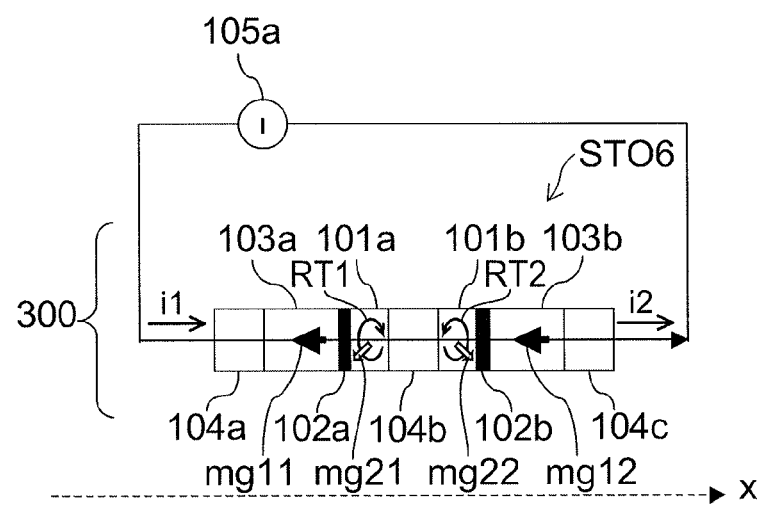

FIGS. 6A to 6B are schematic diagrams illustrating a high-frequency magnetic field generation element according to a sixth embodiment.

FIG. 6A shows the layer structure of an STO 6 according to the sixth embodiment, and FIG. 6B shows a circuit configuration using the STO 6.

As shown in FIG. 6A, the STO 6 includes the first fixed layer 103a, the first free layer 101a, the second free layer 101b, and the second fixed layer 103b.

Although the first fixed layer 103a, the first free layer 101a, the second free layer 101b, and the second fixed layer 103b included in the STO 6 are the same as those of the STO 4, the direction of the magnetization mg12 of the second fixed layer 103b is different.

In the STO 6, the direction of the magnetization mg12 of the second fixed layer 103b is the same as the direction of the magnetization mg11 of the first fixed layer 103a, and is directed in the −X direction, for example.

As shown in FIG. 6B, the STO 6 is provided with the first conductive unit 104a, the second conductive unit 104b, and the third conductive unit 104c.

The second conductive unit 104b is provided between the first free layer 101a and the second free layer 101b. The first stacked body SB1 is provided between the first conductive unit 104a and the second conductive unit 104b, and the second stacked body SB2 is provided between the third conductive unit 104c and the second conductive unit 104b. The first current application mechanism 105a is connected to the first conductive unit 104a and the third conductive unit 104b.

The current i applied from the first current application mechanism 105a flows from the first conductive unit 104a through the first stacked body SB1 and the second stacked body SB2 in the +X direction, and returns from the second conductive unit 104b to the first current application mechanism 105a. Due to the current i, the magnetizations of the first free layer 101a and the second free layer 101b oscillate.

That is, in the STO 6, when the current i1 in the +X direction flows through the first stacked body SB1 and the current i2 in the +X direction flows through the second stacked body SB2, the rotation direction RT1 of the magnetization mg21 in the oscillation of the first free layer 101a becomes opposite to the rotation direction RT2 of the magnetization mg22 in the oscillation of the second free layer 101b.

Furthermore, in the STO 6, when the current i1 in the −X direction flows through the first stacked body SB1 and the current i2 in the −X direction flows through the second stacked body SB2, the rotation direction RT1 and the rotation direction RT2 are reversed.

In the STO 6, the currents i1 and i2 flow in the same direction, and thereby the rotation direction RT1 and the rotation direction RT2 become opposite to each other.

The magnetization mg11 of the first fixed layer 103a and the magnetization mg12 of the second fixed layer 103b may be directed in the +X direction. When the direction of the magnetization mg11 is the same as the direction of the magnetization mg12 and the direction of the current i1 is the same as the direction of the current i2, the rotation direction RT1 and the rotation direction RT2 become opposite to each other.

By the sixth embodiment, since the magnetization direction of the first fixed layer 103a and the magnetization direction of the second fixed layer 103b are the same, magnetization arrangement can be easily made by an external magnetic field. Furthermore, the first free layer 101a and the second free layer 101b can be closely arranged.

In all of the STO 1 to STO 6 described above, the rotation direction RT1 of the magnetization mg21 in the oscillation of the first free layer 101a becomes opposite to the rotation direction RT2 of the magnetization mg22 in the oscillation of the second free layer 101b.

Thus, when the rotation direction RT1 of the magnetization mg21 and the rotation direction RT2 of the magnetization mg22 become opposite to each other, magnetic field components in the plane parallel to the X direction (for example, the XY plane) from the magnetization mg21 and the magnetization mg22 strengthen each other. As a result, stronger high-frequency magnetic field can be applied to a recording medium.

FIGS. 7A to 7D are schematic perspective views illustrating high-frequency magnetic fields.

For convenience of description, FIGS. 7A to 7D show an in-plane magnetic field 502 in the XY plane from the first free layer 101a and the second free layer 101b. A recording medium 501 (e.g. a perpendicular magnetic recording medium) is provided on a surface parallel to the XY plane.

FIGS. 7A to 7D illustrate states with an interval in which the rotating magnetizations mg21 and mg22 of the first free layer 101a and the second free layer 101b each make a quarter turn.

Here, in the XYZ directions, a direction farther from the origin O is illustrated by being marked with "+", and a direction closer to the origin O is illustrated by being marked with "−".

The rotation direction RT1 of the magnetization mg21 of the first free layer 101a is opposite to the rotation direction RT2 of the magnetization mg22 of the second free layer 101b. The rotation period of the magnetization mg21 coincides with the rotation period of the magnetization mg22.

Figure 7A:
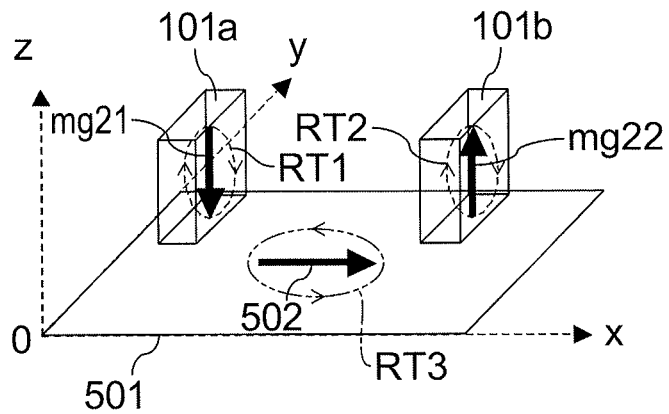
FIGS. 7A to 7D are schematic perspective views illustrating high-frequency magnetic fields.

As shown in FIG. 7A, when the magnetization mg21 of the first free layer 101a is directed in the direction perpendicular to the surface of the recording medium 501 (the XY plane) and toward the recording medium 501 (the −Z direction) and the magnetization mg22 of the second free layer 101b is directed in the direction perpendicular to the surface of the recording medium 501 (the XY plane) and away from the recording medium 501 (the +Z direction), an in-plane magnetic field 502 directed in the +X direction is generated between the first free layer 101a and the second free layer 101b in the surface of the recording medium 501 (the XY plane).

Figure 7B:
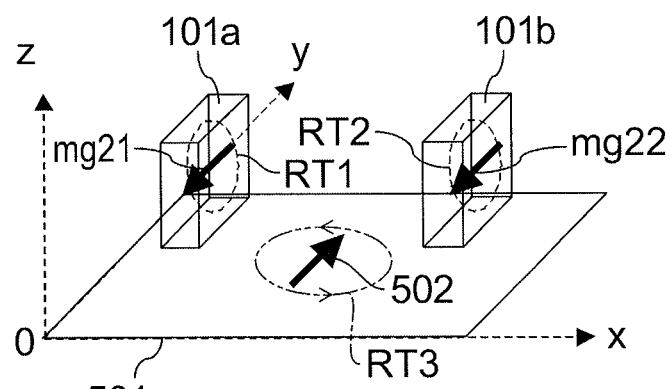

Next, FIG. 7B illustrates a state where the magnetizations mg21 and mg22 shown in FIG. 7A make a quarter turn in the rotation directions RT1 and RT2, respectively.

In this case, the magnetization mg21 of the first free layer 101a is directed in a direction (the −Y direction) parallel to the surface of the recording medium 501 (the XY plane), and the magnetization mg22 of the second free layer 101b is directed in a direction (the −Y direction) parallel to the surface of the recording medium 501 (the XY plane). Thereby, an in-plane magnetic field 502 directed in the +Y direction is generated between the first free layer 101a and the second free layer 101b in the surface of the recording medium 501 (the XY plane).

Figure 7C:
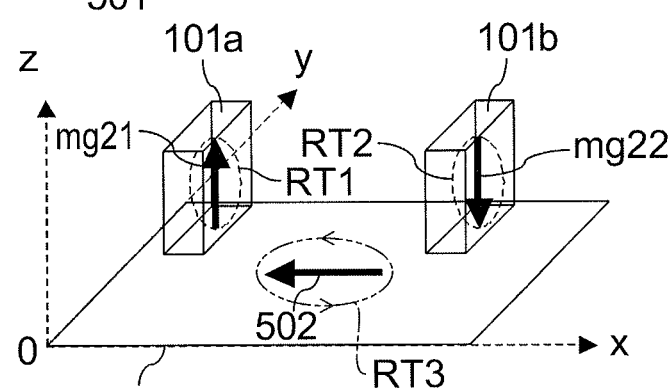

Next, FIG. 7C illustrates a state where the magnetizations mg21 and mg22 shown in FIG. 7B make a quarter turn in the rotation directions RT1 and RT2, respectively.

In this case, the magnetization mg21 of the first free layer 101a is directed in a direction (the +Z direction) perpendicular to the surface of the recording medium 501 (the XY plane), and the magnetization mg22 of the second free layer 101b is directed in a direction (the −Z direction) perpendicular to the surface of the recording medium 501 (the XY plane). Thereby, an in-plane magnetic field 502 directed in the −X direction is generated between the first free layer 101a and the second free layer 101b in the surface of the recording medium 501 (the XY plane).

Figure 7D:
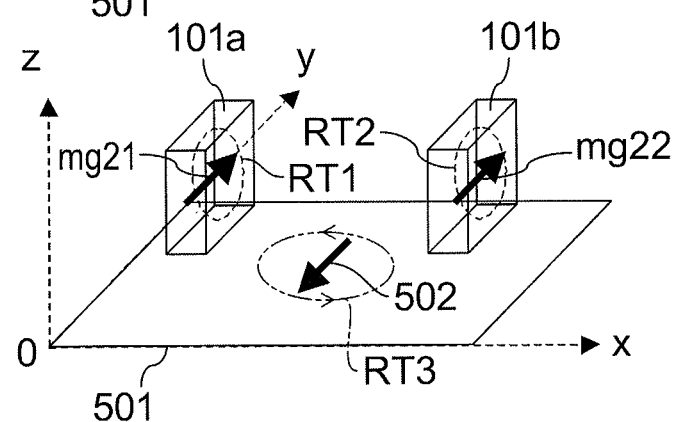

Next, FIG. 7D illustrates a state where the magnetizations mg21 and mg22 shown in FIG. 7C make a quarter turn in the rotation directions RT1 and RT2, respectively.

In this case, the magnetization mg21 of the first free layer 101a is directed in a direction (the +Y direction) parallel to the surface of the recording medium 501 (the XY plane), and the magnetization mg22 of the second free layer 101b is directed in a direction (the +Y direction) parallel to the surface of the recording medium 501 (the XY plane). Thereby, an in-plane magnetic field 502 directed in the −Y direction is generated between the first free layer 101a and the second free layer 101b in the surface of the recording medium 501 (the XY plane).

In the above way, the magnetization mg21 of the first free layer 101a rotates continuously in the rotation direction RT1, and the magnetization mg22 of the second free layer 101b rotates continuously in the rotation direction RT2; thereby, the direction of the in-plane magnetic field 502 changes continuously as shown in FIGS. 7A to 7D. Consequently, the in-plane magnetization rotates in a rotation direction RT3 along the surface of the recording medium 501 (the XY plane).

Thereby, in-plane components of the high-frequency magnetic field work so as to strengthen one another in the surface of the recording medium 501 (the XY plane), and a stronger high-frequency magnetic field can be applied.

Next, the magnetic field strength of the high-frequency magnetic field generation element according to the embodiment is described.

Figure 8:
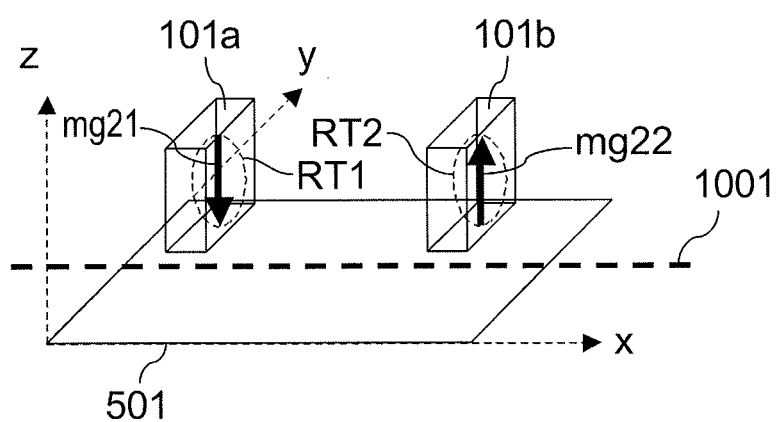
FIG. 8 is a schematic view illustrating a simulation model of the magnetic field strength.

FIG. 8 is a schematic view illustrating a simulation model of the magnetic field strength.

As shown in FIG. 8, two free layers (the first free layer 101a and the second free layer 101b) are disposed away from each other in the X direction, and are placed near to the recording medium 501. The direction of the magnetization mg21 of the first free layer 101a and the direction of the magnetization mg22 of the second free layer 101b rotate due to oscillation.

The first free layer 101a and the second free layer 101b have a saturation magnetization of 1000 erg/cm$^3$, which is a typical value of magnetic materials such as CoFe. The first free layer 101a and the second free layer 101b are in a circular columnar pillar shape with a diameter of 40 nm and a thickness of 10 nm.

In the simulation, the first free layer 101a and the second free layer 101b are disposed at a distance of 5 nm from the surface of the recording medium 501, and the high-frequency magnetic field applied to the surface of the recording medium 501 is calculated on a line 1001 parallel to the X axis on the medium surface passing below the center of the first free layer 101a and the second free layer 101b.

FIG. 9A to FIG. 10B are diagrams illustrating the calculation results of the magnetic field strength.

In FIG. 9A to FIG. 10B, the horizontal axis is the position on the line 1001 parallel to the X axis, and the vertical axis is the magnetic field strength (oersted; Oe).

Figure 9A:
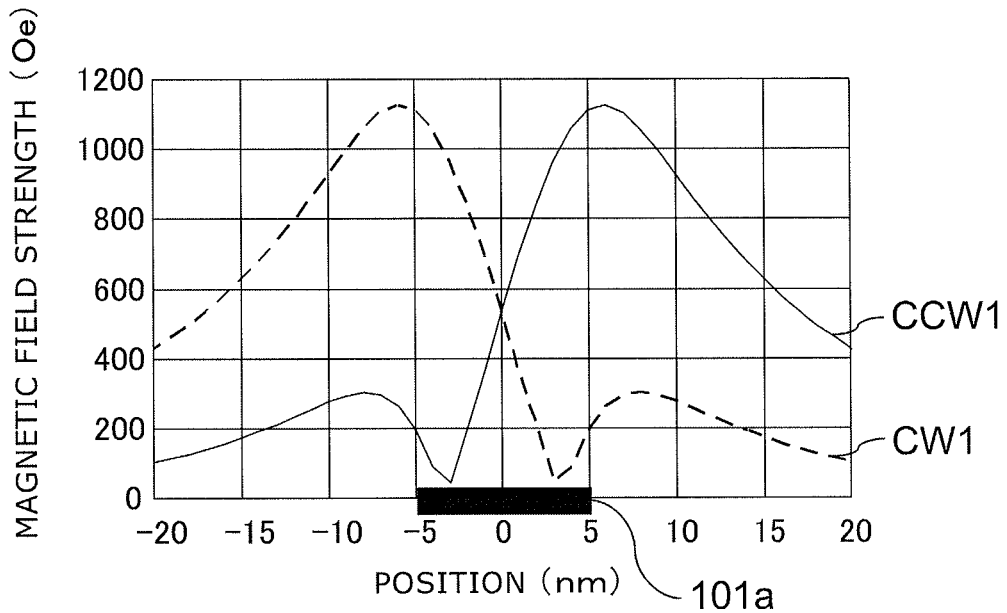
FIG. 9A to FIG. 10B are diagrams illustrating the calculation results of the magnetic field strength.

FIG. 9A is the calculation results of the magnetic field strength of a high-frequency magnetic field generation element according to a first reference example. FIG. 9A shows the results of a calculation in which the high-frequency magnetic field generated from one free layer (the first free layer 101a) rotating clockwise on the YZ plane is calculated and resolved into a clockwise component CW1 and a counterclockwise component CCW1. From the results, it is found that the predominant rotation direction is switched below the center of the free layer (the first free layer 101a). A strong high-frequency magnetic field is obtained in a range of several nanometers from the edge of the free layer (the first free layer 101a), and the maximum value thereof is approximately 1100 (oersteds; Oe).

Figure 9B:
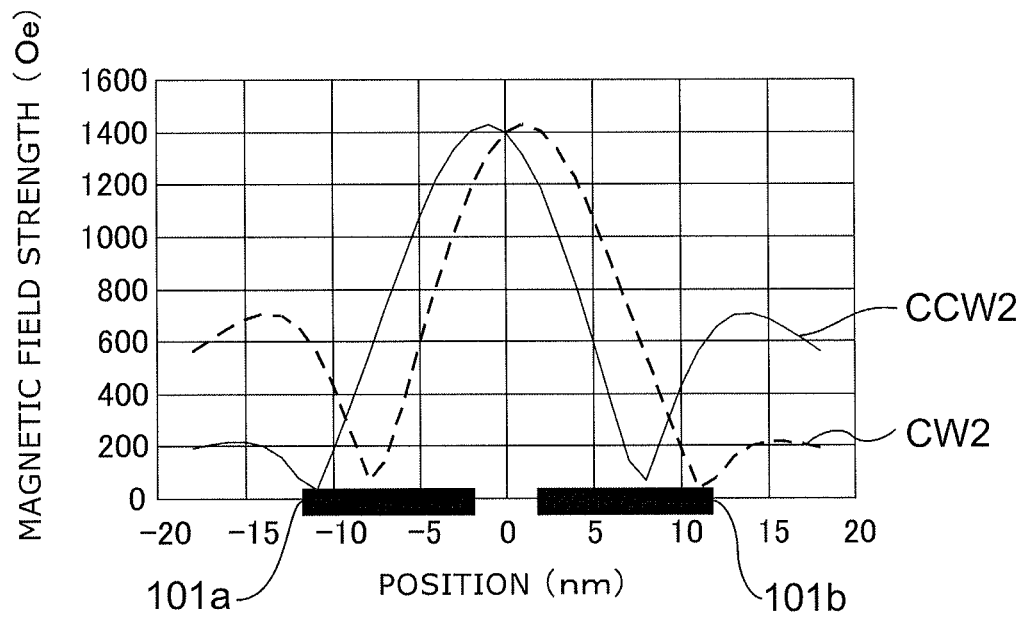
Figure 10A:
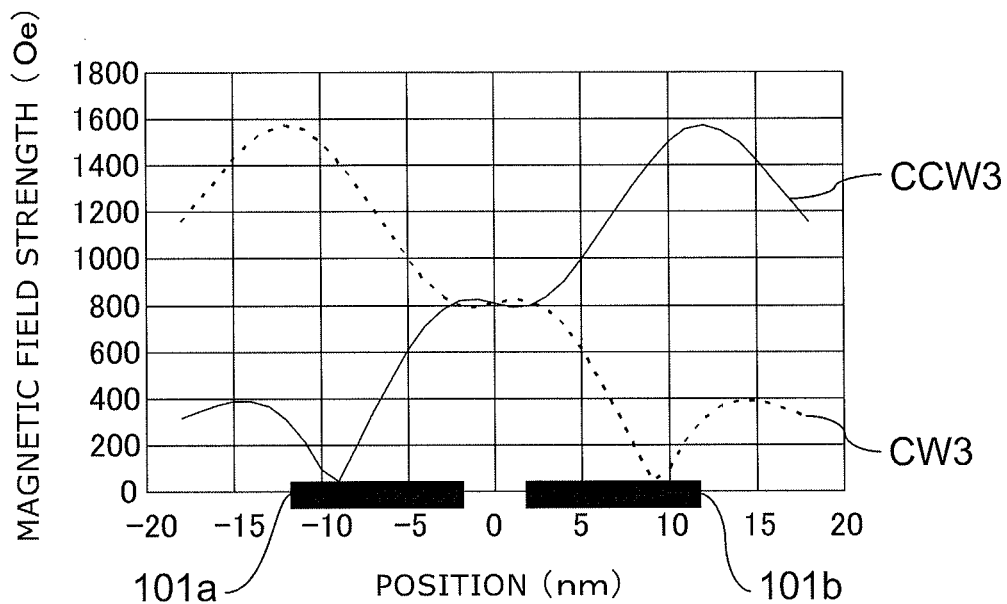

FIG. 9B and FIG. 10A are diagrams illustrating the calculation results of the magnetic field strength of a high-frequency magnetic field generation element according to a second reference example.

FIG. 9B shows the results of calculating a clockwise component CW2 and a counterclockwise component CCW2 of the high-frequency magnetic field generated when the magnetizations of two free layers (the first free layer 101a and the second free layer 101b) are rotated in the same direction with a phase difference of 180 degrees.

FIG. 10A shows the results of calculating a clockwise component CW3 and a counterclockwise component CCW3 of the high-frequency magnetic field generated when the magnetizations of two free layers (the first free layer 101a and the second free layer 101b) are rotated in the same direction with a phase difference of 0 degrees.

As shown in FIG. 9B, in the case where the magnetizations of the two free layers (the first free layer 101a and the second free layer 101b) were rotated in the same direction with a phase difference of 180 degrees, the clockwise component CW2 and the counterclockwise component CCW2 were equally generated between the two free layers (the first free layer 101a and the second free layer 101b), and the maximum values thereof were approximately 1400 (Oe).

Since the strength of the clockwise component CW2 has little difference with the strength of the counterclockwise component CCW2, it is difficult to detect the presence or absence of resonance using the rotation direction of the magnetic field, which is one of the operating principles of read heads utilizing resonance.

As shown in FIG. 10A, in the case where the magnetizations of the two free layers (the first free layer 101a and the second free layer 101b) are rotated in the same direction with a phase difference of 0 degrees, the two free layers (the first free layer 101a and the second free layer 101b) make the same movement. Therefore, they work like one thick free layer, and similarly to the first reference example shown in FIG. 9A, a strong high-frequency magnetic field is obtained at the edge of the free layer, and the maximum value thereof is approximately 1600 (Oe).

Figure 10B:
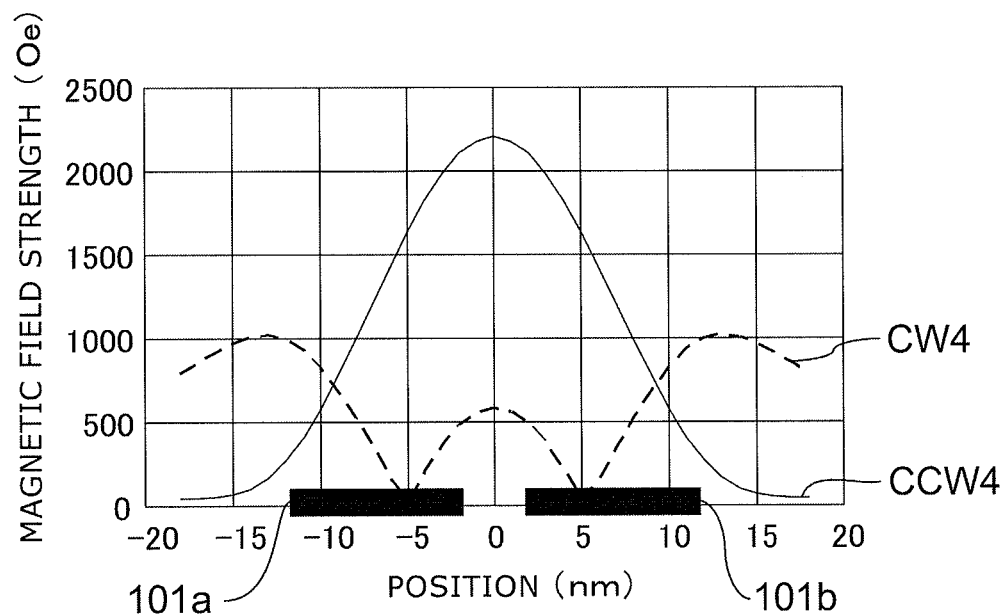

FIG. 10B is a diagram illustrating the calculation results of the magnetic field strength of the high-frequency magnetic field generation element according to the embodiment.

FIG. 10B shows the results of calculating a clockwise component CW4 and a counterclockwise component CCW4 of the high-frequency magnetic field generated when the magnetizations of two free layers (the first free layer 101a and the second free layer 101b) are rotated in directions opposite to each other. The magnetizations of the two free layers (the first free layer 101a and the second free layer 101b) rotate in synchronization in directions opposite to each other.

In this case, the strength of the counterclockwise component CCW4 became strong between the two free layers (the first free layer 101a and the second free layer 101b), and the maximum value thereof is approximately 2200 (Oe).

Thus, in the high-frequency magnetic field generation element according to the embodiment, larger high-frequency magnetic field is great, the selectivity of the rotation direction is generated. Also the spread of the high-frequency magnetic field is narrow. Such characteristics are useful to magnetic recording utilizing resonance.

Next, the synchronization of two free layers (the first free layer 101a and the second free layer 101b) is described.

Methods for synchronizing two free layers include (1) a method in which a high-frequency component is superposed on an applied current to cause the frequencies of the free layers to coincide with the frequency of the applied high-frequency current, (2) a method in which a high-frequency magnetic field is applied from the outside to cause the frequencies of the free layers to coincide with the frequency of the applied high-frequency magnetic field, (3) a method utilizing magnetic and electric interaction working between the two free layers (at least one of the followings: electrical interaction via the current flowing through the two free layers, interaction via a spin current, and magnetic field interaction via dipole field), etc.

Figure 11A:
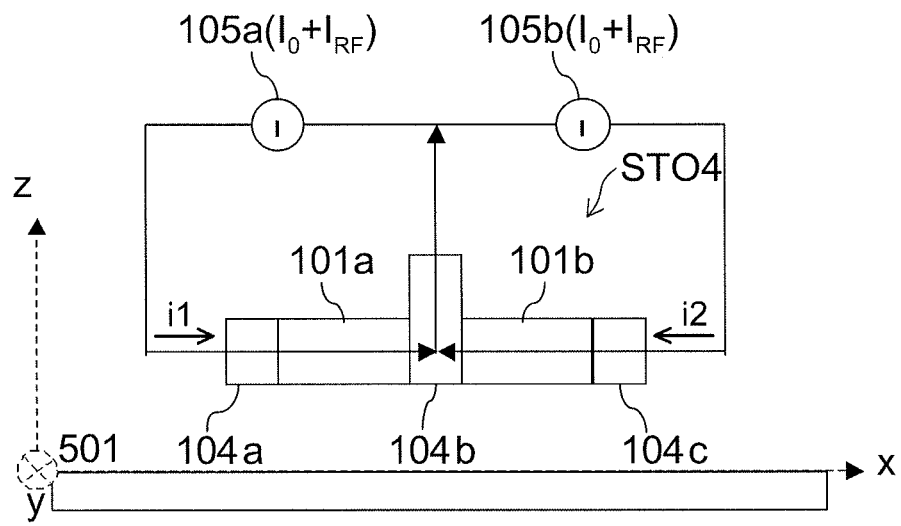
FIGS. 11A to 11B are schematic diagrams illustrating methods for synchronizing two free layers.
Figure 11B:
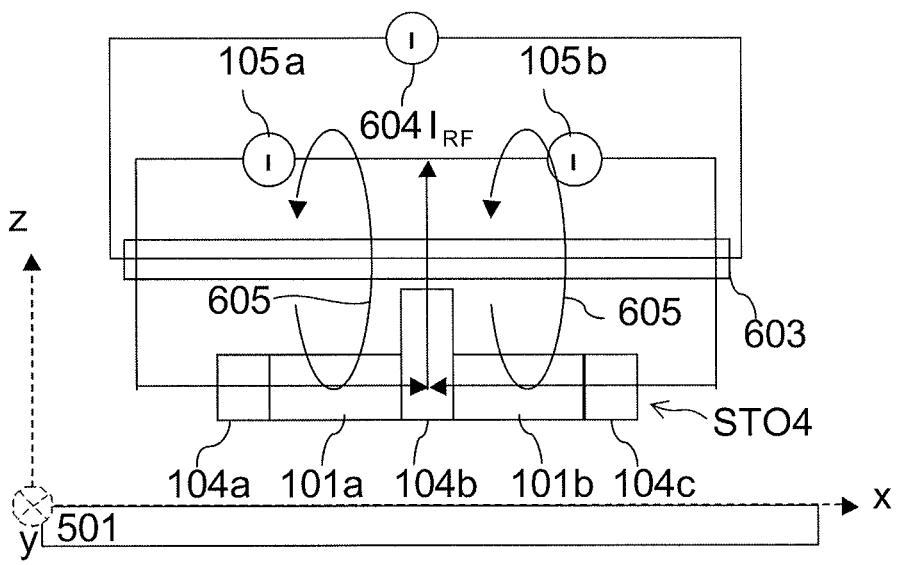

FIGS. 11A to 11B are schematic diagrams illustrating methods for synchronizing two free layers.

FIG. 11A shows a synchronization method for the STO 4 illustrated in FIGS. 4A and 4B as an example. In FIGS. 11A to 11B, for convenience of description, only the first free layer 101a, the second free layer 101b, the first conductive unit 104a, the second conductive unit 104b, and the third conductive unit 104c are shown as the configuration of the STO 4.

FIG. 11A illustrates the synchronization method of (1) mentioned above. As shown in FIG. 11A, currents i1 and i2 are applied to the STO 4 from the first current application mechanism 105a and the second current application mechanism 105b. The currents i1 and i2 are a direct current ($I_0$) on which a high-frequency current ($I_{RF}$) is superposed.

To synchronize the high-frequency current applied to the STO 4 and the oscillations of the magnetizations of the first free layer 101a and the second free layer 101b, it is necessary that the frequency of the high-frequency current applied from the outside and the oscillation frequencies of the first free layer 101a and the second free layer 101b be close. Hence, using the characteristic that the oscillation frequencies of the first free layer 101a and the second free layer 101b depend on current, the oscillation frequencies are adjusted by the applied direct current to be synchronized with the applied high-frequency current. Furthermore, the in-plane component of spin torque acts on the first free layer 101a and the second free layer 101b by interposing a fixed layer having a magnetization in the plane (in the +Y direction) between the first free layer 101a and the second conductive unit 104b and between the second free layer 101b and the second conductive unit 104b or by using an external magnetic field or the like to provide the first fixed layer 103a and the second fixed layer 103b with a component orthogonal to the X direction. Thereby, the conditions of the phase described in FIG. 7 can be satisfied.

FIG. 11B illustrates the synchronization method of (2) mentioned above. As shown in FIG. 11B, a high-frequency transmission line 603 is disposed near the first free layer 101a and the second free layer 101b. By applying a high-frequency signal to the high-frequency transmission line 603 using a high-frequency power source 604, a high-frequency magnetic field 605 is applied to the first free layer 101a and the second free layer 101b. Also in this case, since it is necessary that the frequency of the high-frequency magnetic field applied from the outside and the oscillation frequencies of the first free layer 101a and the second free layer 101b be close, the oscillation frequencies of the first free layer 101a and the second free layer 101b are adjusted by the applied direct current. Thereby, the oscillation frequencies of the first free layer 101a and the second free layer 101b are synchronized with the applied high-frequency magnetic field.

The high-frequency transmission line 603 is provided on the +Z direction side of the first free layer 101a and the second free layer 101b; therefore, the current magnetic field generated from the high-frequency current is applied to the first free layer 101a and the second free layer 101b in the Y direction. This magnetic field and the oscillations of the first free layer 101a and the second free layer 101b are synchronized; thereby, the conditions of the phase described in FIG. 7 can be satisfied.

Seventh Embodiment

FIG. 12 to FIG. 17 are schematic views illustrating magnetic heads according to a seventh embodiment.

Figure 12:
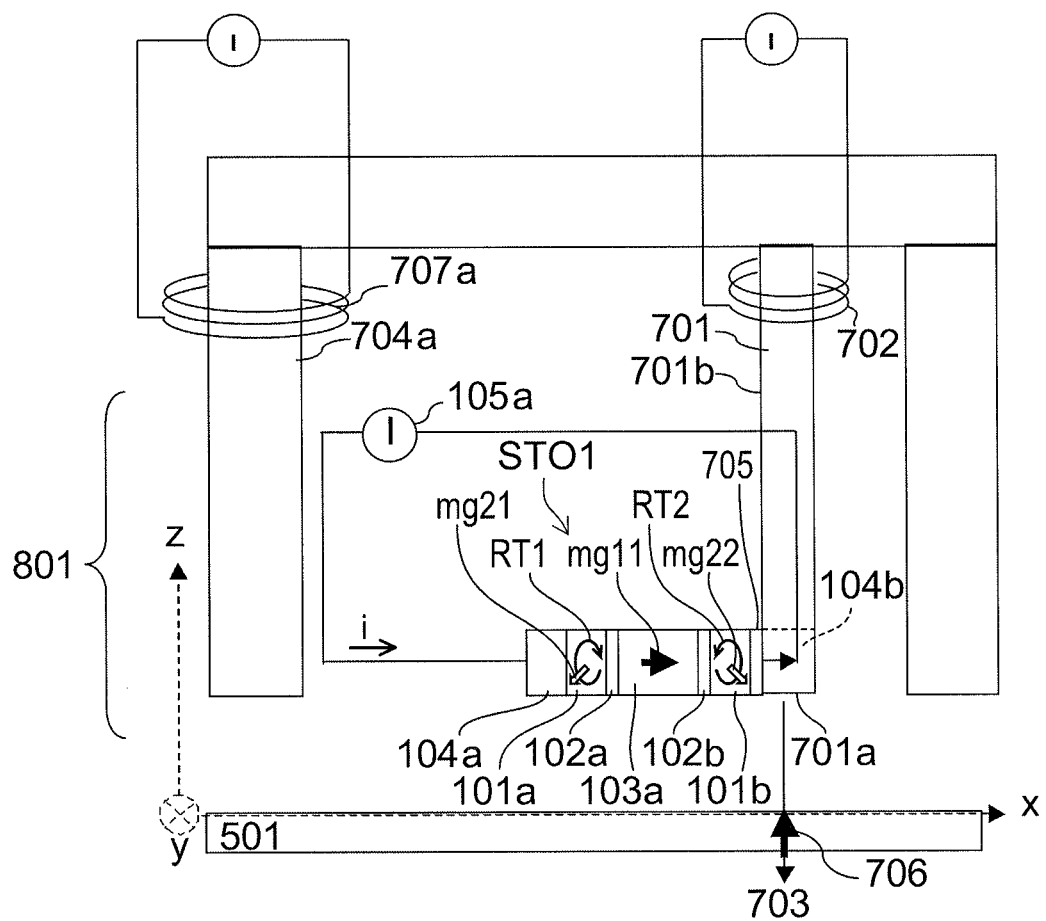
FIG. 12 to FIG. 17 are schematic views illustrating magnetic heads according to a seventh embodiment.

A magnetic head 801 shown in FIG. 12 uses the STO 1 according to the first embodiment.

The magnetic head 801 includes the STO 1 and a main magnetic pole 701. The main magnetic pole 701 is what applies a recording magnetic field to a magnetic recording medium. The main magnetic pole 701 has a first surface 701a opposed to the recording medium 501 and a second surface 701b intersecting with the first surface 701a.

In the magnetic head 801, the STO 1 is provided opposite to the second surface 701b of the main magnetic pole 701. The second conductive unit 104b in the STO 1 is electrically connected to the main magnetic pole 701.

The magnetic head 801 includes a main magnetic pole coil 702 that magnetizes the main magnetic pole 701, a return path 704a opposed to the main magnetic pole 701, and a return path coil 707a that magnetizes the return path 704a.

In the configuration of the magnetic head 801, since a high-frequency magnetic field is enhanced between two free layers (the first free layer 101a and the second free layer 101b), the distance between the high-frequency magnetic field and a writing magnetic field 703 is large. Hence, the first free layer 101a and the second free layer 101b are disposed upstream (on the −X direction side) with respect to the movement of the recording medium 501 (movement in the +X direction), and the writing magnetic field is applied after the high-frequency magnetic field is applied to the medium.

To cause a magnetic resonance to a magnetization directed in the +Z direction on the XY plane, it is necessary to generate a counterclockwise high-frequency magnetic field on the XY plane. Such a high-frequency magnetic field is generated on the medium surface close to the region between the first free layer 101a and the second free layer 101b when the magnetization of the first free layer 101a rotates clockwise and the magnetization of the second free layer 101b rotates counterclockwise on the YZ plane.

In the magnetic head 801, the oscillations mentioned above are achieved by applying a current i from the current application mechanism 105a in the +X direction. The magnetic substance absorbs the generated high-frequency magnetic field; thus, magnetization reversal occurs by a magnetic field smaller than the coercive field.

To cause a magnetic resonance to a magnetization directed in the −Z direction on the XY plane, it is necessary to change the rotation directions of the magnetizations of the first free layer 101a and the second free layer 101b. Methods for reversing the rotation directions of the magnetizations of the first free layer 101a and the second free layer 101b include the following two:

<1> Reverse the direction of the current. Reverse the direction of the current applied to the first free layer 101a and the second free layer 101b in accordance with the direction for writing. Thereby, the rotation directions of the magnetizations due to the oscillations of the first free layer 101a and the second free layer 101b become opposite.

<2> Reverse the directions of the magnetizations of the first fixed layer 103a and the second fixed layer 103b. The magnetic field emitted from the main magnetic pole 701 is applied to the recording medium 501 and applied also to the first fixed layer 103a and the second fixed layer 103b at the same time.

By adjusting the coercive field of the first fixed layer 103a lower than the magnetic field applied to the first fixed layer 103a from the main magnetic pole 701, the direction of the magnetization of the first fixed layer 103a changes in accordance with the magnetic field direction for writing. Thereby, the rotation directions of the magnetizations of the first free layer 101a and the second free layer 101b are reversed.

To adjust the magnetic field applied to the first free layer 101a and the second free layer 101b, current through return path coils 707a and 707b provided for return paths 704a and 704b can be utilized.

Figure 13:
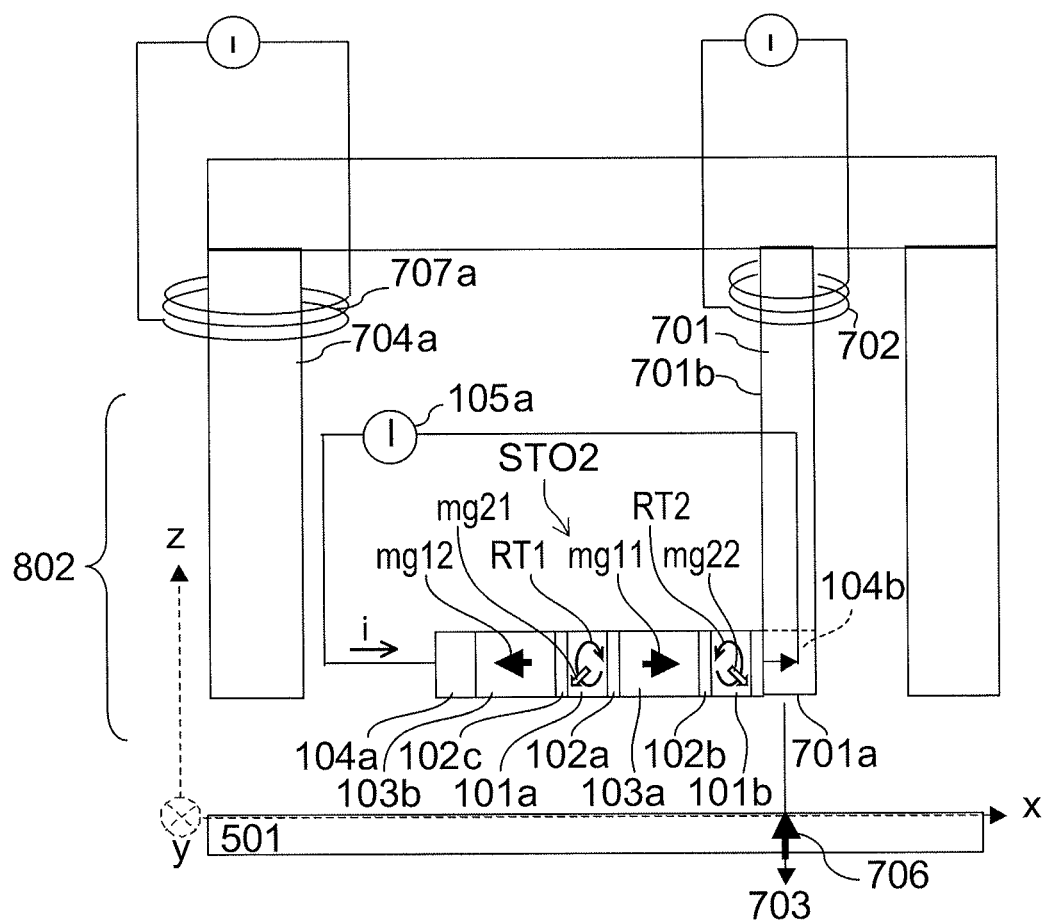

A magnetic head 802 shown in FIG. 13 uses the STO 2 according to the second embodiment.

In the magnetic head 802, the STO 2 is provided opposite to the second surface 701b of the main magnetic pole 701. The second conductive unit 104b in the STO 2 is electrically connected to the main magnetic pole 701.

Otherwise, the configuration and operations of the magnetic head 802 are similar to those of the magnetic head 801.

Figure 14:
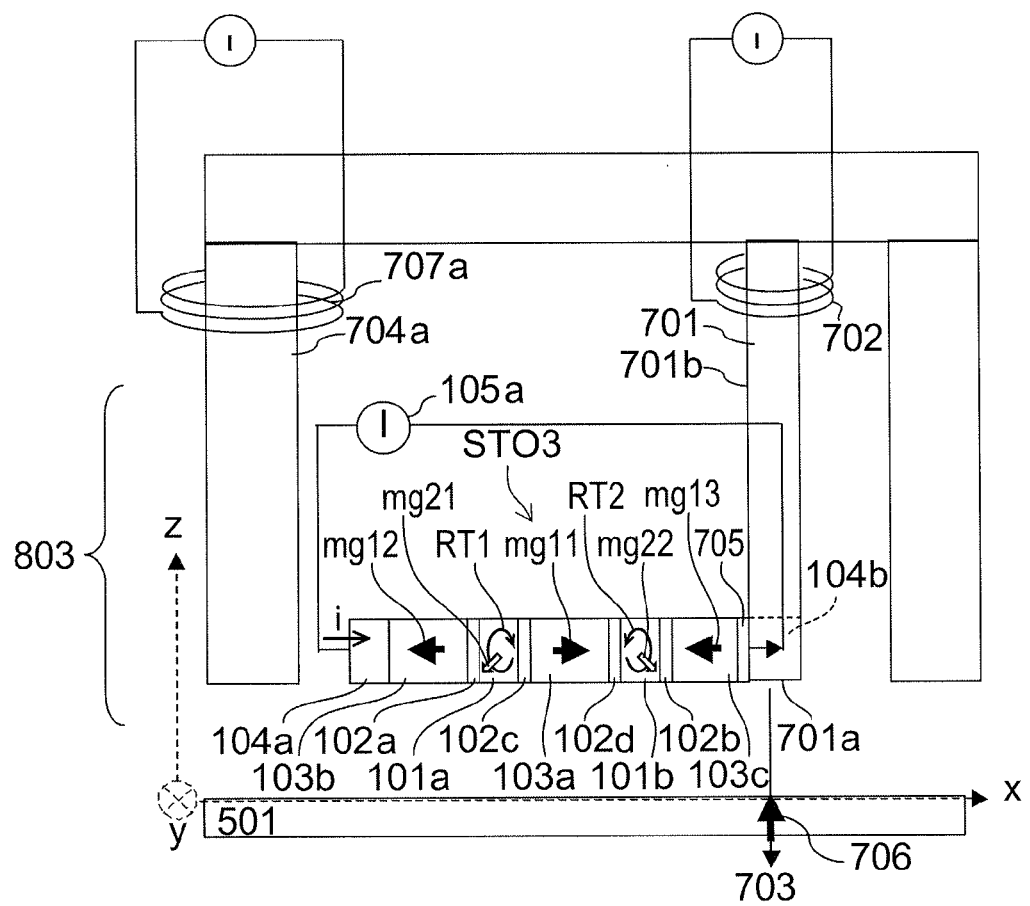

A magnetic head 803 shown in FIG. 14 uses the STO 3 according to the third embodiment.

In the magnetic head 803, the STO 3 is provided opposite to the second surface 701b of the main magnetic pole 701. The second conductive unit 104b in the STO 3 is electrically connected to the main magnetic pole 701.

Otherwise, the configuration and operations of the magnetic head 803 are similar to those of the magnetic head 802.

Figure 15:
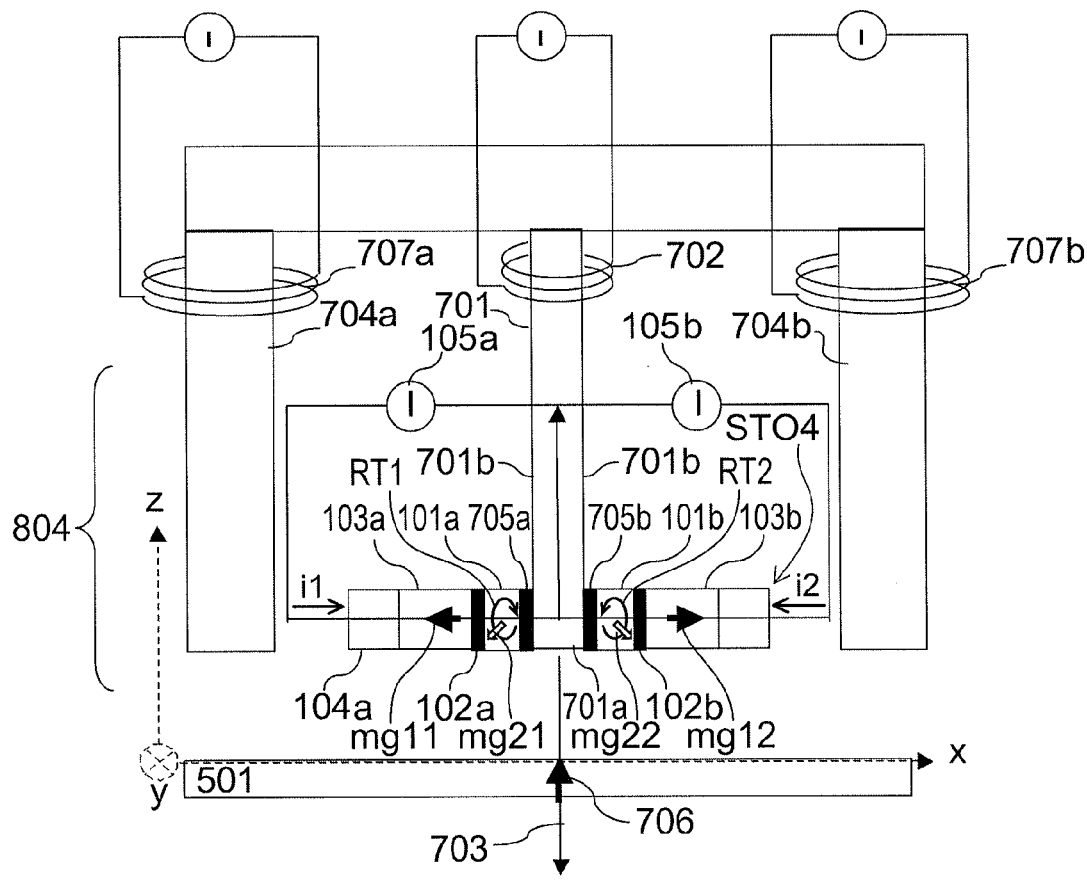

A magnetic head 804 shown in FIG. 15 uses the STO 4 according to the fourth embodiment. The STO 4 is disposed along with the main magnetic pole 701. In the magnetic head 804, the second conductive unit 104b is provided between the first free layer 101a and the second free layer 101b. The second conductive unit 104b is electrically connected to the main magnetic pole 701.

The magnetic head 804 includes the main magnetic pole coil 702 that magnetizes the main magnetic pole 701, return paths 704a and 704b opposed to the main magnetic pole 701, and return path coils 707a and 707b that magnetize the return paths 704a and 704b.

Intermediate layers 705a and 705b that reduce the spin of a current flowing are provided between the main magnetic pole 701 and the first free layer 101a and between the main magnetic pole 701 and the second free layer 101b, respectively. These prevent the current from the main magnetic pole 701 from providing torque to the first free layer 101a and the second free layer 101b. A material with a relatively short spin diffusion length such as Ru may be used for the intermediate layers 705a and 705b.

In the magnetic head 804, a writing magnetic field 703 is generated in the main magnetic pole 701 by passing a current through the main magnetic pole coil 702.

Here, an operation is considered in which the medium magnetization 706 (herein, in the +Z direction) of the recording medium 501 composed of a single layer or multiple layers existing on the XY plane is changed to the −Z direction by the writing magnetic field 703.

To cause a magnetic resonance to a magnetization directed in the +Z direction on the XY plane, it is necessary to generate a counterclockwise high-frequency magnetic field on the XY plane. Such a high-frequency magnetic field is generated on the medium surface close to the region between the two free layers 101a and 101b when the magnetization of the first free layer 101a rotates clockwise and the magnetization of the second free layer 101b rotates counterclockwise on the YZ plane.

In the structure of the magnetic head 804 (the magnetization of the first fixed layer 103a: the −X direction, the magnetization of the second fixed layer 103b: the +X direction), the oscillations mentioned above are achieved by passing a current from the first fixed layer 103a to the first free layer 101a and from the second fixed layer 103b to the second free layer 101b.

The frequency of the generated high-frequency magnetic field may be set to coincide with the resonance frequency of the medium magnetization 706 to allow the high-frequency magnetic field to be absorbed; thus, magnetization reversal by a magnetic field smaller than the coercive field is possible.

When a magnetic medium composed of multiple layers is used, the layers may be designed to have different resonance frequencies; thereby, resonance can be caused only to a selected layer by adjusting the frequency of the high-frequency magnetic field applied. As a result, the switching magnetic field of only the selected layer can be reduced, and the manipulation (writing) of the magnetization of the selected layer becomes possible without influencing the magnetizations of the other layers.

Next, an operation is considered in which a medium magnetization 706 directed in the −Z direction is changed to the +Z direction by the writing magnetic field 703.

To cause a magnetic resonance to a magnetization directed in the −Z direction on the XY plane, it is necessary to generate a clockwise high-frequency magnetic field on the XY plane in contrast to the example mentioned above. Therefore, it is necessary to change the rotation directions of the magnetizations of the first free layer 101a and the second free layer 101b. As methods for reversing the rotation directions of the magnetizations of the first free layer 101a and the second free layer 101b, the two mentioned above, <1> and <2>, are used.

The directions of the magnetizations of the first fixed layer 103a and the second fixed layer 103b and the direction of the current are not limited to the above, and may be freely selected to the extent that the rotation direction of the magnetization of the first free layer 101a becomes opposite to the rotation direction of the magnetization of the second free layer 101b.

Figure 16:
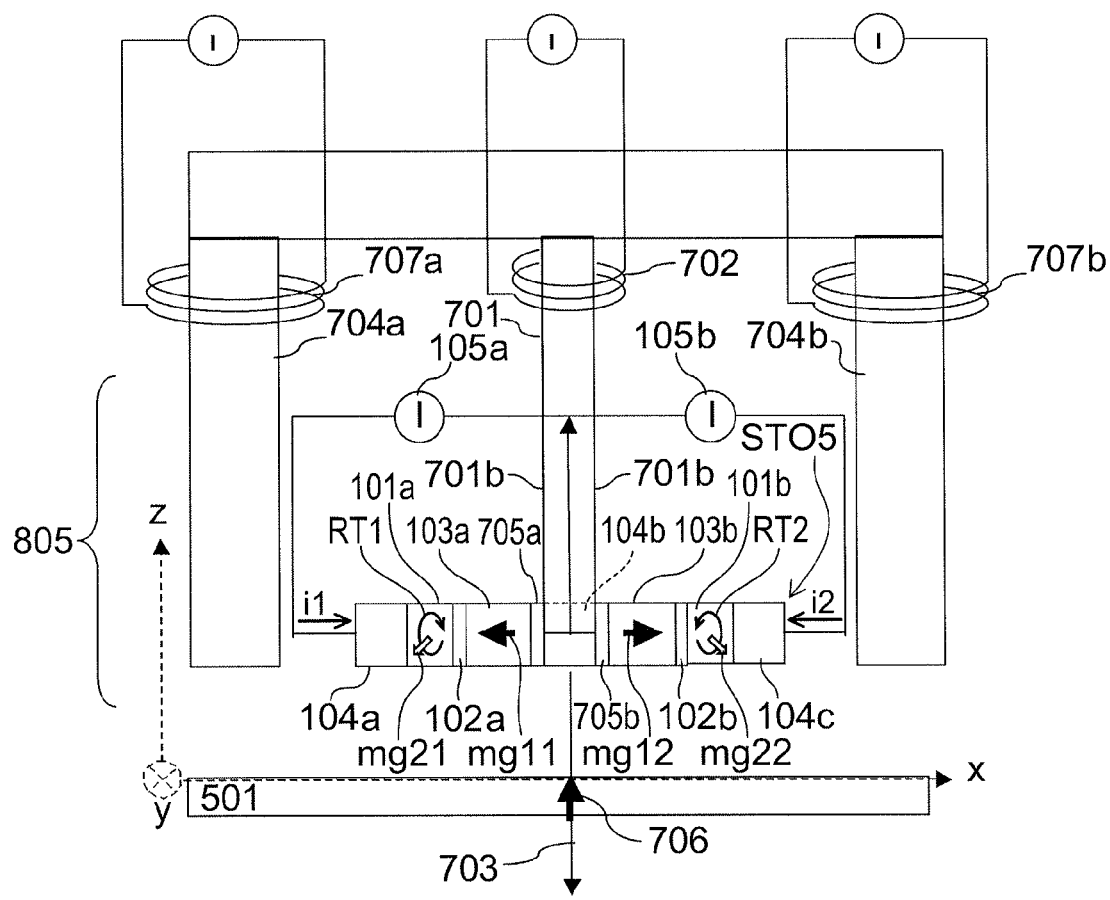

A magnetic head 805 shown in FIG. 16 uses the STO 5 according to the fifth embodiment.

The STO 5 is disposed along with the main magnetic pole 701. In the magnetic head 805, the second conductive unit 104b is provided between the first fixed layer 103a and the second fixed layer 103b. The second conductive unit 104b is electrically connected to the main magnetic pole 701.

Otherwise, the configuration and operations of the magnetic head 805 are similar to those of the magnetic head 804.

Figure 17:
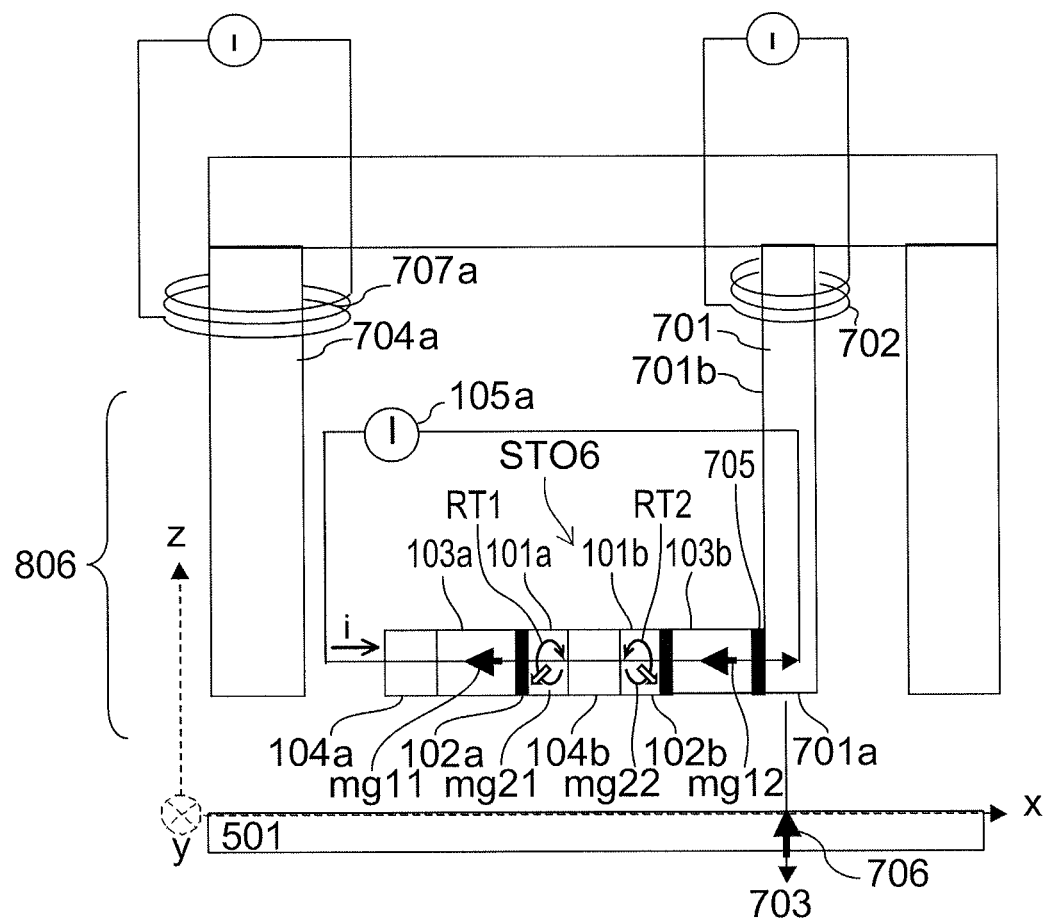

A magnetic head 806 shown in FIG. 17 uses the STO 6 according to the sixth embodiment.

In the magnetic head 806, the STO 6 is provided opposite to the second surface 701b of the main magnetic pole 701. The second conductive unit 104b in the STO 6 is electrically connected to the main magnetic pole 701.

Otherwise, the configuration and operations of the magnetic head 806 are similar to those of the magnetic head 801.

Eighth Embodiment

Figure 18:
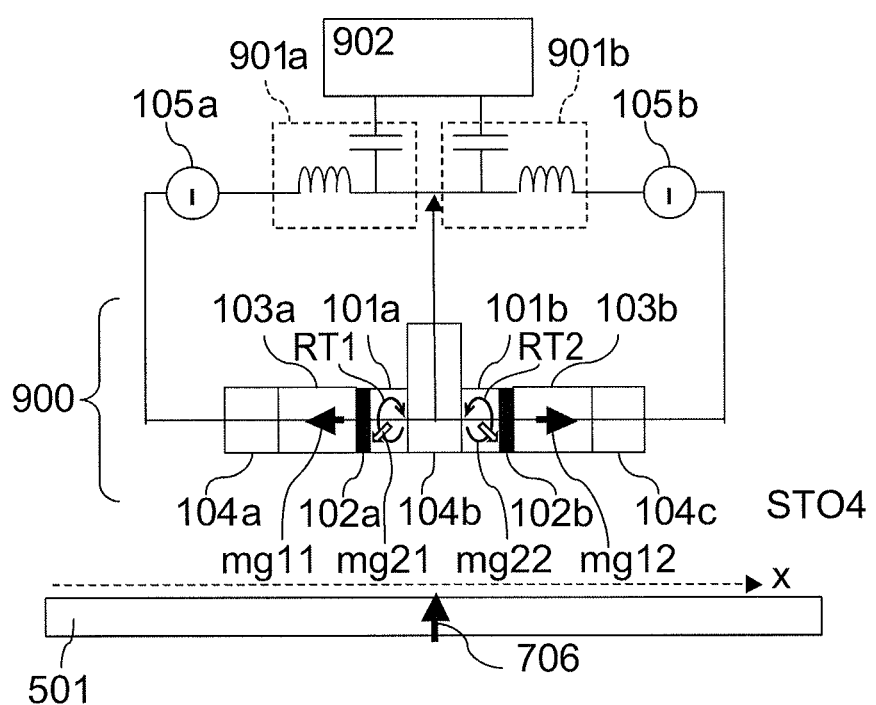
FIG. 18 is a schematic diagram illustrating a magnetic read head according to an eighth embodiment.

FIG. 18 is a schematic diagram illustrating a magnetic read head according to an eighth embodiment.

As shown in FIG. 18, a magnetic read head 900 according to the embodiment includes the high-frequency magnetic field generation element according to one of the embodiments described above and a detection unit 902 that detects a high-frequency component originating from the current flowing through the high-frequency magnetic field generation element.

The STO 4 shown in FIGS. 4A and 4B is used as an example in the magnetic read head 900 shown in FIG. 18.

A high-frequency separation circuit 901a is connected in series to the first current application mechanism 105a that applies a current to the STO 4. A high-frequency separation circuit 901b is connected in series to the second current application mechanism 105b that applies a current to the STO 4. The detection unit 902 converts the magnetic information recorded in the recording medium 501 into an electric signal based on high-frequency signals separated in the first high-frequency separation circuit 901a and the second high-frequency separation circuit 901b.

The STO 4 used for the magnetic read head 900 has a similar structure to a magnetoresistive effect element in which resistance changes with the relative angles of the magnetizations of two magnetic layers. Therefore, at the time of the oscillations of the first free layer 101a and the second free layer 101b, resistance changes at the GHz level in accordance with the directions of the magnetizations of the first free layer 101a and the second free layer 101b, and consequently high-frequency signals are produced. The high-frequency signals are separated from the direct-current signal by the first high-frequency separation circuit 901a and the second high-frequency separation circuit 901b. By inputting the separated high-frequency signals to the detection unit 902, the movements of the magnetizations of the first free layer 101a and the second free layer 101b are electrically detected.

In the arrangement shown in FIG. 18 (the magnetization of the first fixed layer: the −X direction, the magnetization of the second fixed layer: the +X direction), a counterclockwise high-frequency magnetic field is generated on the XY plane by passing a current from the first fixed layer 103a to the first free layer 101a and from the second fixed layer 103b to the second free layer 101b.

At this time, in the case where the medium magnetization 706 of the recording medium 501 composed of a single layer or multiple layers is directed in the +Z direction, a magnetic resonance occurs, and energy is absorbed into the medium. On the other hand, in the case where the medium magnetization 706 is directed in the −Z direction, no magnetic resonance occurs.

The changes of the movements of the magnetizations of the first free layer 101a and the second free layer 101b resulting from the presence or absence of magnetic resonance are detected by the detection unit 902; thereby, the direction of the medium magnetization 706 can be detected.

Magnetic heads 700 and 800 and the magnetic reproducing head 900 according to the embodiment can also be used for, for example, multiple-layer recording and multiple-layer reproducing for a recording medium 501 composed of multiple layers.

To perform multiple-layer recording and multiple-layer reproducing, a recording medium 501 in which multiple recording layers are stacked in the direction orthogonal to the recording surface is used. Different magnetic resonance frequencies are set in the recording layers of the recording medium 501. The magnetic resonance frequency can be differentiated between recording layers by, for example, using different materials for the recording layers.

To perform multiple-layer recording using the magnetic heads 700 and 800 according to the embodiment, a high-frequency signal almost equal to the magnetic resonance frequency of a recording layer in which recording is performed is superposed on the currents i, i1, and i2 of the high-frequency magnetic field generation element according to the embodiment. Thereby, a high-frequency magnetic field is generated from the high-frequency magnetic field generation element.

The high-frequency magnetic field acts on a recording layer having a magnetic resonance frequency almost equal to the frequency of the high-frequency magnetic field generated from the high-frequency magnetic field generation element out of the multiple recording layers. Thus, writing is performed in only a specific recording layer out of the multiple recording layers.

To perform multiple-layer reproducing using the magnetic read head 900 according to the embodiment, similarly to multiple-layer recording, a high-frequency signal almost equal to the magnetic resonance frequency set in a recording layer to be read is superposed on the currents i, i1, and i2. Thus, only the information written in a specific recording layer out of the plurality of recording layers can be extracted by the detection unit 902.

Ninth Embodiment

Figure 19:
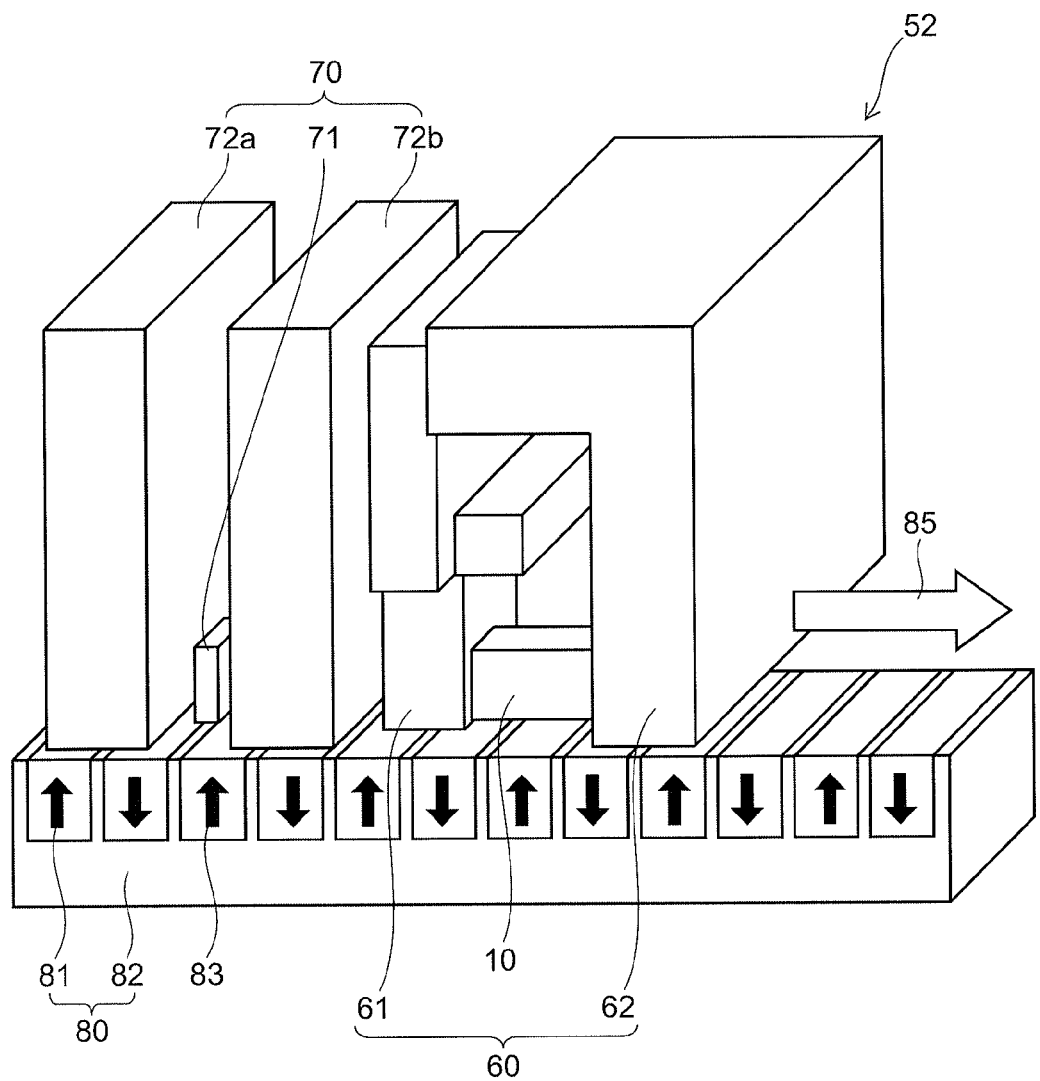
FIG. 19 is a schematic perspective view illustrating the configuration of a magnetic write/read head according to a ninth embodiment.

FIG. 19 is a schematic perspective view illustrating the configuration of a magnetic write/read head according to a ninth embodiment.

As shown in FIG. 19, a magnetic write/read head 52 according to the embodiment includes a writing head unit 60 and a read head unit 70.

The writing head unit 60 includes a main magnetic pole 61, a circulating magnetic pole 62, and a spin torque oscillator 10 provided between them. Any high-frequency magnetic field generation element according to the embodiments described above is used as the spin torque oscillator 10.

The read head unit 70 includes a first magnetic shield layer 72a, a second magnetic shield layer 72b, and a magnetic reproducing element 71 provided between the first magnetic shield layer 72a and the second magnetic shield layer 72b.

As the magnetic reproducing element 71, any high-frequency magnetic field generation element according to the embodiments described above may be used. To increase resolution, the magnetic read element 71 is provided between two magnetic shield layers, namely, the first and second magnetic shield layers 72a and 72b.

The components of the read head unit 70 mentioned above and the components of the write head unit 60 mentioned above are isolated by a not-shown insulator such as alumina.

As shown in FIG. 19, a magnetic recording medium 80 is placed opposite to a main magnetic pole medium facing surface 61s of the magnetic write/read head 52. The main magnetic pole 61 applies a recording magnetic field (writing magnetic field) to the magnetic recording medium 80. The main magnetic pole medium facing surface 61s of the magnetic write/read head 52 may be the major surface of the main magnetic pole 61 opposed to the magnetic recording medium 80 installed to the magnetic write/read head 52.

As shown in FIG. 19, the magnetic recording medium 80 includes a medium substrate 82 and a magnetic recording layer 81 provided thereon. By the magnetic field applied from the writing head unit 60, the magnetization 83 of the magnetic recording layer 81 is controlled to a prescribed direction, and writing is thus performed. At this time, the magnetic recording medium 80 moves relative to the magnetic write/read head 52 in a medium movement direction 85.

On the other hand, the read head unit 70 reads the direction of the magnetization of the magnetic recording layer 81.

As shown in FIG. 19, since the high-frequency magnetic field generation element according to the embodiments described above is used as the spin torque oscillator 10, a high-frequency magnetic field can be generated by passing a current through the first free layer 101a and the second free layer 101b. The density of the current passed through the first free layer 101a and the second free layer 101b (drive current density) is appropriately adjusted to obtain a desired oscillation state.

The main magnetic pole 61 and the circulating magnetic pole 62 are composed of a soft magnetic layer having a relatively large saturation magnetic flux density of FeCo, CoFe, CoNiFe, NiFe, CoZrNb, FeN, FeSi, FeAlSi, or the like.

In the main magnetic pole 61, a portion on the side of the main magnetic pole medium facing surface 61s and the other portions may be made of different materials. That is, for example, to increase the magnetic field generated in the magnetic recording medium 80 and the spin torque oscillator 10, the portion on the side of the main magnetic pole medium facing surface 61s may be made of FeCo, CoNiFe, FeN, or the like having a very large saturation magnetic flux density, and the other portions may be made of NiFe or the like having a very high magnetic permeability. To increase the magnetic field generated in the magnetic recording medium 80 and the spin torque oscillator 10, the portion on the side of the main magnetic pole medium facing surface 61s of the main magnetic pole 61 may be configured to be smaller in size than the back gap portion. Thereby, the magnetic flux is concentrated in the portion on the side of the main magnetic pole medium facing surface 61s, and a high-strength magnetic field can be generated.

A hardly oxidizable material with a low electric resistance such as Ti and Cu may be used for the coil 63 of the main magnetic pole 61.

The magnetic write/read head 52 according to the embodiment having such a configuration can make stable oscillation at a low current density, generate a stable high-frequency magnetic field by means of a spin torque oscillator in which the in-plane high-frequency magnetic field has a high strength, and provide a magnetic write head capable of achieving high-density magnetic recording.

Tenth Embodiment

Figure 20:
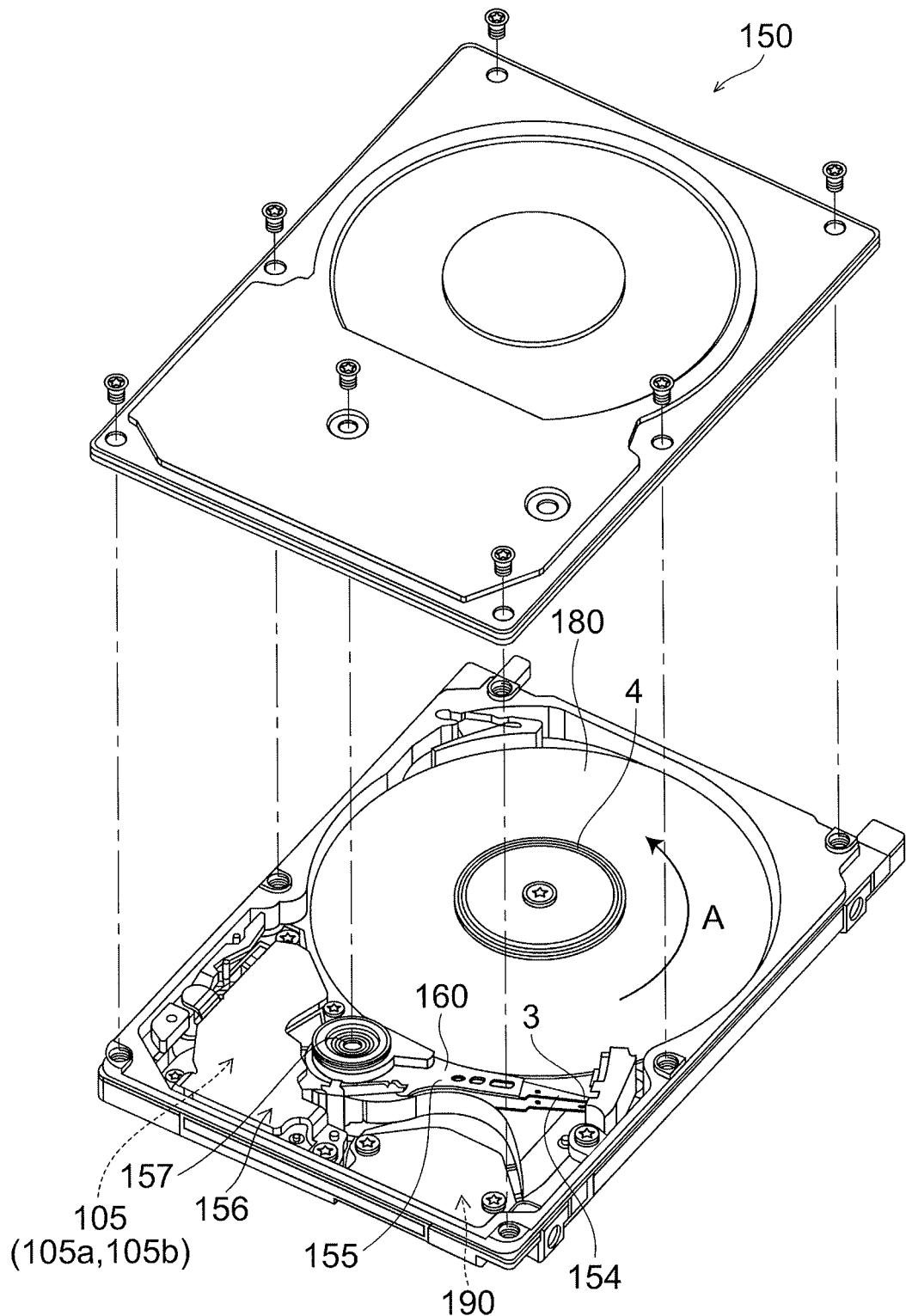
FIG. 20 is a schematic perspective view illustrating the configuration of a magnetic recording apparatus according to a tenth embodiment.

FIG. 20 is a schematic perspective view illustrating the configuration of a magnetic recording apparatus according to a tenth embodiment.

Figure 21A:
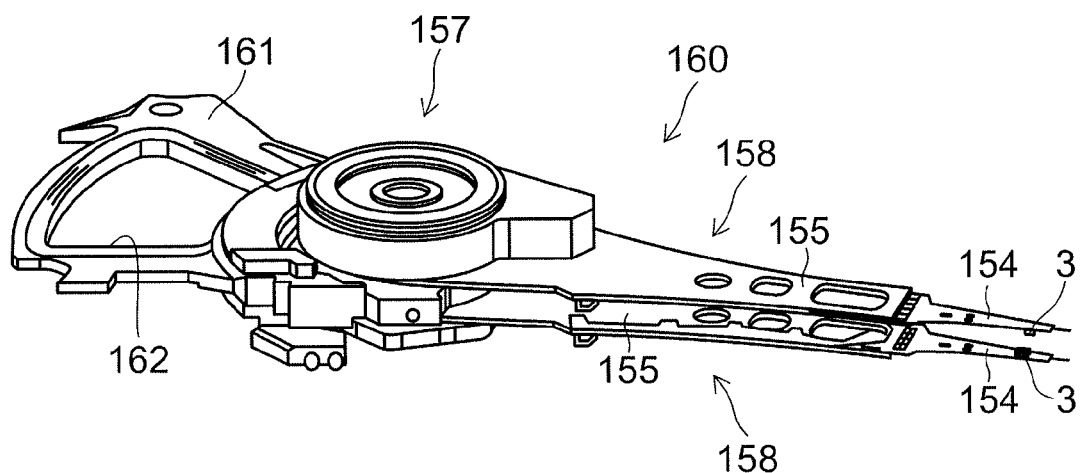
FIGS. 21A and 21B are schematic perspective views illustrating the configuration of part of the magnetic recording apparatus according to the tenth embodiment.
Figure 21B:
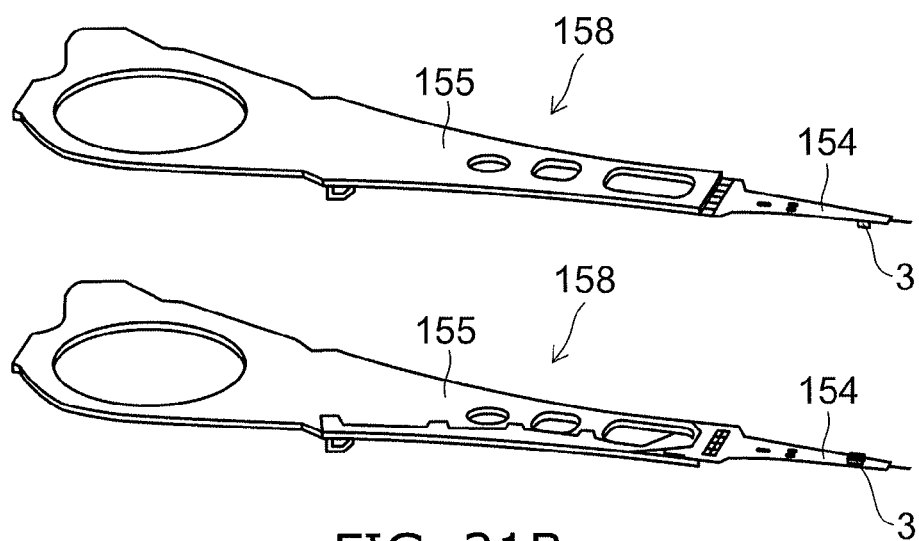

FIGS. 21A and 21B are schematic perspective views illustrating the configuration of part of the magnetic recording apparatus according to the tenth embodiment.

As shown in FIG. 20, a magnetic recording apparatus 150 according to the embodiment is an apparatus of a system using a rotary actuator. In the drawing, a recording medium disk 180 is mounted on a spindle motor 4, and is rotated in the direction of arrow A by a not-shown motor that responds to a control signal from a not-shown driving device control unit.

The magnetic recording apparatus 150 according to the embodiment may include a plurality of recording medium disks 180.

A head slider 3 that performs the recording and reproduction of information stored in the recording medium disk 180 is provided at the tip of a suspension 154 in a thin film form. Here, the head slider 3 is mounted with, for example, the magnetic write/read head 52 according to the embodiment described above near its tip.

The magnetic recording apparatus 150 includes a current supply unit 105 that passes a current to the first free layer 101a and the second free layer 101b of the high-frequency magnetic field generation element according to the embodiments described above used for the magnetic write/read head 52.

When the recording medium disk 180 rotates, the pressing pressure by the suspension 154 and the pressure generated at the medium facing surface (air bearing surface: ABS) of the head slider 3 are balanced, and the medium facing surface of the head slider 3 is held above the surface of the recording medium disk 180 with a prescribed flying height. Also what is called a "contact-traveling type" may be used in which the head slider 3 is in contact with the recording medium disk 180.

The suspension 154 is connected to one end of an actuator arm 155 including a bobbin that holds a not-shown driving coil and the like. A voice coil motor 156 that is a kind of linear motor is provided at the other end of the actuator arm 155. The voice coil motor 156 may be composed of a not-shown driving coil wound around the bobbin of the actuator arm 155 and a magnetic circuit composed of a permanent magnet and an opposed yoke that are provided opposite to each other so as to sandwich the driving coil.

The actuator arm 155 is held by not-shown ball bearings provided at two positions, the top and bottom, of a bearing portion 157, and can rotationally slide freely by means of the voice coil motor 156. Consequently, the magnetic head can be moved to an arbitrary position on the recording medium disk 180.

FIG. 21A illustrates the configuration of part of the magnetic recording apparatus according to the embodiment, and is an enlarged perspective view of a head stack assembly 160. FIG. 21B is a perspective view illustrating a magnetic head assembly (head gimbal assembly, HGA) 158, which constitutes part of the head stack assembly 160.

As shown in FIG. 21A, the head stack assembly 160 includes the bearing portion 157, a head gimbal assembly 158 extending from the bearing portion 157, and a support frame 161 extending from the bearing portion 157 in the opposite direction to the HGA and supporting the coil 162 of the voice coil motor As shown in FIG. 21B, the head gimbal assembly 158 includes the actuator arm 155 extending from the bearing portion 157 and the suspension 154 extending from the actuator arm 155.

The head slider 3 provided with the magnetic write/read head 52 according to the embodiment described above is provided at the tip of the suspension 154.

That is, the magnetic head assembly (head gimbal assembly) 158 according to the embodiment includes the magnetic write head according to the embodiment, the head slider 3 mounted with the magnetic write head, the suspension 154 mounted with the head slider 3 on one end, and the actuator arm 155 connected to the other end of the suspension 154.

The suspension 154 includes lead wires (not shown) for writing and reading signals, for a heater for adjusting the flying height, and for the spin torque oscillator, and the lead wires and the respective electrodes of the magnetic head incorporated in the head slider 3 are electrically connected. Not-shown electrode pads are provided in the head gimbal assembly 158. In this specific example, the electrode pad is provided eight in number. That is, two electrode pads for the coil of the main magnetic pole 61, two electrode pads for the magnetic reproducing element 71, two electrode pads for DFH (dynamic flying height), and two electrode pads for the spin torque oscillator 10 are provided.

A signal processing unit 190 is provided that uses the magnetic head to perform the writing and reading of signals on the magnetic recording medium. The signal processing unit 190 is provided on the back side, in FIG. 20, of the magnetic recording apparatus 150 illustrated in FIG. 20, for example. The input/output lines of the signal processing unit 190 are connected to the electrode pads of the head gimbal assembly 158 to be electrically connected to the magnetic head.

Thus, the magnetic recording apparatus 150 according to the embodiment includes the magnetic recording medium (the recording medium disk 180), the head stack assembly 160 mentioned above, the signal processing unit 190 that uses the magnetic head mounted on the head stack assembly 160 to perform the writing and reading of signals on the magnetic recording medium, and the current supply unit 105 that passes a current to the first free layer 101a and the second free layer 101b of the magnetic head. The first current application mechanism 105a and the second current application mechanism 105b are used as the current supply unit 105.

By the magnetic recording apparatus 150 according to the embodiment, using the spin torque oscillator of the embodiments mentioned above and the magnetic head according to the embodiment mentioned above, a magnetic recording apparatus can be provided that can make stable oscillation at a low current density, generate a stable high-frequency magnetic field by means of a spin torque oscillator in which the in-plane high-frequency magnetic field has a high strength, and achieve high-density magnetic recording.

As described above, the high-frequency magnetic field generation element, the magnetic head, the magnetic head assembly, and the magnetic recording apparatus according to the embodiment can improve recording density.

Hereinabove, embodiments of the invention are described with reference to specific examples. However, the invention is not limited to these specific examples. For example, one skilled in the art may appropriately select specific configurations of components of high-frequency magnetic field generation elements, magnetic heads, magnetic head assemblies, and magnetic recording apparatuses from known art and similarly practice the invention. Such practice is included in the scope of the invention to the extent that similar effects thereto are obtained.

Further, combinations within the extent of technical feasibility of any two or more components of the specific examples and all high-frequency magnetic field generation elements, magnetic heads, magnetic head assemblies, and magnetic recording apparatuses that can be obtained by an appropriate design modification by one skilled in the art also are included in the scope of the invention to the extent that the spirit of the invention is included.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A high-frequency magnetic field generation element comprising:
   a first fixed layer, a direction of a magnetization of the first fixed layer being fixed and including a component parallel to a first direction;
   a first free layer stacked with the first fixed layer, a direction of a magnetization of the first free layer being variable and including a component orthogonal to the first direction; and
   a second free layer stacked with the first fixed layer, a direction of a magnetization of the second free layer being variable and including a component orthogonal to the first direction,
   the first fixed layer being provided between the first free layer and the second free layer,
   the first direction being parallel to a stacking direction of the first fixed layer, the first free layer, and the second free layer,
   the magnetization of the first free layer and the magnetization of the second free layer oscillating by a current flowing through the first free layer, the second free layer, and the first fixed layer, and
   a rotation direction of the magnetization in the oscillation of the first free layer being opposite to a rotation direction of the magnetization in the oscillation of the second free layer.

2. The element according to claim 1, wherein the magnetization of the first free layer and the magnetization of the second free layer oscillate in synchronization with a high-frequency signal superposed on the current.

3. The element according to claim 1, wherein the magnetization of the first free layer and the magnetization of the second free layer rotate in synchronization by at least one of interaction by the current, interaction via a spin current, and dipole interaction.

4. The element according to claim 1, wherein the magnetization of the first free layer and the magnetization of the second free layer rotate in synchronization with a frequency of a high-frequency magnetic field applied from an outside.

5. The element according to claim 1, wherein the direction of the magnetization of the first free layer and the direction of the magnetization of the second free layer are identical to each other when the direction of the magnetization of the first free layer rotated by the oscillation and the direction of the magnetization of the second free layer rotated by the oscillation are parallel to a recording surface of a magnetic recording medium and the direction of the magnetization of the first free layer and the direction of the magnetization of the second free layer are opposite to each other when the direction of the magnetization of the first free layer rotated by the oscillation and the direction of the magnetization of the second free layer rotated by the oscillation are perpendicular to the recording surface.

6. A high-frequency magnetic field generation element comprising:
   a first fixed layer, a direction of a magnetization of the first fixed layer being fixed and including a component parallel to a first direction;
   a first free layer stacked with the first fixed layer, a direction of a magnetization of the first free layer being variable and including a component orthogonal to the first direction;
   a second fixed layer, a direction of a magnetization of the second fixed layer being fixed and including a component parallel to the first direction; and
   a second free layer stacked with the second fixed layer, a direction of a magnetization of the second free layer being variable and including a component orthogonal to the first direction,
   the first direction being parallel to a stacking direction of the first fixed layer, the first free layer, and the second free layer,
   the magnetization of the first free layer oscillating by a current flowing through the first fixed layer and the first free layer,
   the magnetization of the second free layer oscillating by a current flowing through the second fixed layer and the second free layer, and
   a rotation direction of the magnetization in the oscillation of the first free layer being opposite to a rotation direction of the magnetization in the oscillation of the second free layer.

7. The element according to claim 6, wherein the magnetization of the first free layer and the magnetization of the second free layer oscillate in synchronization with a high-frequency signal superposed on the current flowing through the first free layer and the current flowing through the second free layer, respectively.

8. The element according to claim 6, wherein the magnetization of the first free layer and the magnetization of the second free layer rotate in synchronization by at least one of interaction by the current flowing through the first free layer and the current flowing through the second free layer, interaction via a spin current, and dipole interaction.

9. The element according to claim 6, wherein the magnetization of the first free layer and the magnetization of the second free layer rotate in synchronization with a frequency of a high-frequency magnetic field applied from an outside.

10. The element according to claim 6, wherein the direction of the magnetization of the first free layer and the direction of the magnetization of the second free layer are identical to each other when the direction of the magnetization of the first free layer rotated by the oscillation and the direction of the magnetization of the second free layer rotated by the oscillation are parallel to a recording surface of a magnetic recording medium and the direction of the magnetization of the first free layer and the direction of the magnetization of the second free layer are opposite to each other when the direction of the magnetization of the first free layer rotated by the oscillation and the direction of the magnetization of the second free layer rotated by the oscillation are perpendicular to the recording surface.

11. The element according to claim 6, further comprising:
    a conductive unit provided between the first free layer and the second free layer,
    the first free layer being provided between the conductive unit and the first fixed layer,
    the second free layer being provided between the conductive unit and the second fixed layer.

12. The element according to claim 6, further comprising:
    a conductive unit provided between the first fixed layer and the second fixed layer,
    the first fixed layer being provided between the conductive unit and the first free layer,
    the second fixed layer being provided between the conductive unit and the second free layer.

13. A magnetic head comprising:
    a main magnetic pole;

a coil for recording configured to generate a recording magnetic field in the main magnetic pole; and a high-frequency magnetic field generation element disposed along with the main magnetic pole, the high-frequency magnetic field generation element including:

a first fixed layer, a direction of a magnetization of the first fixed layer being fixed and including a component parallel to a first direction;

a first free layer stacked with the first fixed layer, a direction of a magnetization of the first free layer being variable and including a component orthogonal to the first direction; and a second free layer stacked with the first fixed layer, a direction of a magnetization of the second free layer being variable and including a component orthogonal to the first direction, the first fixed layer being provided between the first free layer and the second free layer, the first direction being parallel to a stacking direction of the first fixed layer, the first free layer, and the second free layer, the magnetization of the first free layer and the magnetization of the second free layer oscillating by a current flowing through the first free layer, the second free layer, and the first fixed layer, and a rotation direction of the magnetization in the oscillation of the first free layer being opposite to a rotation direction of the magnetization in the oscillation of the second free layer.

14. The magnetic head according to claim 13, further comprising:

a return path opposed to the main magnetic pole, at least part of the high-frequency magnetic field generation element being disposed between the main magnetic pole and the return path.

15. The magnetic head according to claim 13, wherein the high-frequency magnetic field generation element further includes:

a conductive unit provided between the first free layer and the second free layer, and a second fixed layer, a direction of a magnetization of the second fixed layer being fixed and including a component parallel to the first direction, the first free layer is provided between the conductive unit and the first fixed layer, the second free layer is provided between the conductive unit and the second fixed layer, and the main magnetic pole is electrically connected to the conductive unit.

16. The magnetic head according to claim 13, wherein the high-frequency magnetic field generation element further includes:

a second fixed layer, a direction of a magnetization of the second fixed layer being fixed and including a component parallel to the first direction, and a conductive unit provided between the first fixed layer and the second fixed layer, the first fixed layer is provided between the conductive unit and the first free layer, the second fixed layer is provided between the conductive unit and the second free layer, and the main magnetic pole is electrically connected to the conductive unit.

17. The magnetic head according to claim 13, further comprising a detection unit configured to detect a high-frequency component from a current flowing through the high-frequency magnetic field generation element.

18. The magnetic head according to claim 13, wherein the magnetization of the first free layer and the magnetization of the second free layer oscillate in synchronization with a high-frequency signal superposed on the current.

19. The magnetic head according to claim 13, wherein the magnetization of the first free layer and the magnetization of the second free layer rotate in synchronization by at least one of interaction by the current, interaction via a spin current, and dipole interaction.

20. The magnetic head according to claim 13, wherein the magnetization of the first free layer and the magnetization of the second free layer rotate in synchronization with a frequency of a high-frequency magnetic field applied from an outside.

* * * * *